(12) United States Patent
Takizawa

(10) Patent No.: US 12,720,783 B2
(45) Date of Patent: Aug. 25, 2026

(54) SEMICONDUCTOR DEVICE AND METHOD OF MANUFACTURING THE SAME

(71) Applicant: Renesas Electronics Corporation, Tokyo (JP)

(72) Inventor: Naoki Takizawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 374 days.

(21) Appl. No.: 18/433,803

(22) Filed: Feb. 6, 2024

(65) Prior Publication Data

US 2024/0274697 A1 Aug. 15, 2024

(30) Foreign Application Priority Data

Feb. 14, 2023 (JP) ................................ 2023-020830

(51) Int. Cl.
*H01L 29/739* (2006.01)
*H10D 12/00* (2025.01)
*H10D 12/01* (2025.01)
*H10D 62/10* (2025.01)

(52) U.S. Cl.
CPC ......... *H10D 12/481* (2025.01); *H10D 12/038* (2025.01); *H10D 62/127* (2025.01)

(58) Field of Classification Search
CPC .. H10D 12/481; H10D 12/038; H10D 62/127; H10D 84/811; H10D 1/47; H10D 64/231
See application file for complete search history.

(56) References Cited

U.S. PATENT DOCUMENTS

2017/0287828 A1* 10/2017 Sawada ............... H10W 70/658
2019/0035920 A1* 1/2019 Nagata ................... H10D 64/23
2022/0102538 A1* 3/2022 Nakazawa ........... H10D 12/481
2022/0165727 A1 5/2022 Kuroda et al.
2023/0027990 A1* 1/2023 Nishi ...................... H10D 1/47
2024/0162353 A1* 5/2024 Nagata ................. H10D 12/481
2024/0243198 A1* 7/2024 Yanagigawa ........ H10D 30/668
2025/0081490 A1* 3/2025 Iwakiri ................ H10D 62/393
2025/0194229 A1* 6/2025 Tsuchiya .............. H10D 84/615

FOREIGN PATENT DOCUMENTS

JP 2022-82244 A 6/2022

* cited by examiner

*Primary Examiner* — Thao P Le
(74) *Attorney, Agent, or Firm* — RIMON P.C.

(57) ABSTRACT

Two resistance elements are each formed so as to overlap a portion of each of a gate pad and a gate wiring in a plan view, and are electrically connected to the gate pad and the gate wiring. A p-type well region is formed so as to overlap a portion of each of the two insulating films, the two resistance elements, the gate pad, the gate wiring, and the emitter electrode in the plan view. The emitter electrode includes a convex portion that protrudes toward a gate pad side in a Y direction in the plan view. The convex portion is located between the two resistance elements in the plan view. The convex portion and the well region are electrically connected via a hole formed in an interlayer insulating film.

19 Claims, 38 Drawing Sheets

EE
1A
EE
100
EEa
GW
GP
2A
EEa
X
Y
Z

1A
IAC
AC
IAC
PB
NE
PB
NE
PB
PB
NE
PB
NE
PB
A
A
CH2
PG
(EE)
TR
GE2
PB
Y
Z
X
PB
(PF)
TR
GE1
CH1
PG
(EE)
TR
GE1
PB
(PF)
TR
GE2
PG
(EE)
CH2
PB
(PF)

A-A CROSS SECTION

PW
CH4
IF1
Rg
CH4
CH3
CH3
CH3
CH3
CH3
B
B
EEa
GWa
C
C
2A
GP
CH4
IF1
Rg
CH4
GW
EE
X
Y
Z

B-B CROSS SECTION
C-C CROSS SECTION
EEa
PG
CH3
IL
GW
GP
PR
CH4
Rg
IF2
IF1
PW
NV
NS
PC
CE
SUB
Z
X
Y

A–A CROSS SECTION

B-B CROSS SECTION
C-C CROSS SECTION
HM1
HM1
HM1
NV
NV
SUB
X
Z
Y

B-B CROSS SECTION
C-C CROSS SECTION
HM1
IF1
NV
SUB
X
Y
Z

A-A CROSS SECTION

C-C CROSS SECTION
B-B CROSS SECTION
IF1
PW
NV
SUB
X
Y
Z

FIG. 16

A-A CROSS SECTION

IF3 TR PF NV NHB TR PF TR NHB TR PF SUB X Z Y

C-C CROSS SECTION
B-B CROSS SECTION
IF1
IF3
PW
NV
SUB
X
Y
Z

A-A CROSS SECTION

A–A CROSS SECTION
TR
PF
NV
GI
GE2
(CF1)
NHB
GE2
(CF1)
GI
PF
GI
GE1
(CF1)
NHB
GE1
(CF1)
GI
TR
PF
SUB
X
Z
Y

A-A CROSS SECTION
TR
PF
NV
GE2 GI
NHB
GI GE2
TR
CF2
IF2
PF
TR
GE1 GI
NHB
GI GE1
TR
PF
SUB
Z
X
Y

C-C CROSS SECTION
B-B CROSS SECTION
CF2
IF2
IF1
PW
NV
RP2
SUB
X
Y
Z

A-A CROSS SECTION
TR
PF
NV
GE2 GI
NHB
GI GE2
PF
GE1 GI
NHB
GI GE1
TR
PF
SUB
Z
X
Y

B-B CROSS SECTION
C-C CROSS SECTION
Rg
(CF2)
IF2
IF1
PW
NV
PW
NV
SUB
X
Z
Y

A–A CROSS SECTION
NE
TR
TR
PB
TR
PF
SUB
PB
TR
PF
NV
Z
Y
X
GI GE1
NHB
PB
GE1 GI
PF
PB
GI GE2
NHB
PB
GE2 GI

A–A CROSS SECTION

C-C CROSS SECTION
B-B CROSS SECTION
IL
IF2
IF1
PR
PW
NV
CH4
CH4
PR
Rg
PR
CH4
CH4
PR
CH3
IL
PR
PW
NV
SUB
X
Z
Y

A–A CROSS SECTION
EE
IL
PB
TR
PF
NV
CH2
PG
TR
CH1
NE
PG
NE
GI
GE2
PR
PB
NHB
GE1
SUB
X
Y
Z

B-B CROSS SECTION
C-C CROSS SECTION
EEa
PG
CH3
IL
GW
GP
PR
PW
NV
SUB
CH4
Rg
IF1
IF2
Z
X
Y

PW
CH4
IF1
Rg
CH4
CH3
CH3
CH3
CH3
CH3
IF1a
EEa
GWa
B
B
C
C
2A
GP
CH4
IF1
Rg
CH4
GW
EE
X
Y
Z

B-B CROSS SECTION
C-C CROSS SECTION
EEa
PG
CH3
IL
GW
IF1a
GP
PR
CH4
Rg
IF2
IF1
PW
NV
NS
PC
CE
SUB
Z
Y
X

2A
GP
CH4
IF1
Rg
GW
EE
PW
CH3
Rga
IF1a
EEa
GWa
B
C
X
Y
Z

B-B CROSS SECTION
C-C CROSS SECTION
EEa
PG
CH3
IL
GW
IF1a
IF2
Rga
GP
PR
PW
NV
SUB
GW
PR
PG
CH4
PG
CH4
PR
Rg
PR
PG
CH4
PG
CH4
GP
IL
IF2
IF1
PR
PW
NV
NS
PC
CE
X
Y
Z

2A
GP
CH4
IF1
Rg
CH4
GW
EE
PW
CH4
IF1
Rg
CH4
CH3
CH3
CH3
CH3
CH3
Rga
IF1a
EEa
GWa
B
B
C
C
X
Y
Z

B-B CROSS SECTION
C-C CROSS SECTION
EEa
PG
CH3
IL
GW
IF1a
IF2
Rga
GP
PR
PW
NV
SUB
CH4
Rg
IF1
NS
PC
CE
X
Y
Z

2A
GP
CH4
Rg, IF2
CH4
GW
EE
PW
GWa
EEa
B
B
C
C
CH3
X
Y
Z

EE
1A
EE
100
EEa
GW
GPa
GP
GPa
2A
EEa
X
Y
Z

CH4
IF1
Rg
CH4
PW
CH3
CH3
GPa
EEa
CH3
GWa
CH3
CH3
2A
GP
CH4
IF1
Rg
CH4
GW
EE
X
Y
Z

SEMICONDUCTOR DEVICE AND METHOD OF MANUFACTURING THE SAME

CROSS-REFERENCE TO RELATED APPLICATIONS

The present application claims priority from Japanese Patent Application No. 2023-020830 filed on Feb. 14, 2023, the content of which is hereby incorporated by reference to this application.

BACKGROUND

The present invention relates to a semiconductor device and a method of manufacturing the same, in particularly, to a semiconductor device including a resistance element electrically connected to a gate pad and a method of manufacturing the same.

As a power device, an IGBT (Insulated Gate Bipolar Transistor) to which a vertical trench gate structure is applied is known. In a semiconductor device (semiconductor chip) including a power device, a resistance element is connected to the gate pad as part of a protection circuit for protecting the semiconductor device from a surge voltage and the like applied to the gate pad.

There is a disclosed technique listed below. [Patent Document 1] Japanese Unexamined Patent Application Publication No. 2022-82244

For example, Patent Document 1 discloses a semiconductor device including an IGBT and a resistance element connected to a gate pad.

SUMMARY

For example, in a motor control system using a three-phase motor, an IGBT is used as a motor driver. An emitter electrode of the high-side side IGBT and a collector electrode of the low-side side IGBT are connected in series.

Here, as disclosed also in Patent Document 1, defects may occur in a p-type collector region formed on a lower surface of the semiconductor substrate of the high-side side IGBT due to damage during dicing. In this case, when the low-side side IGBT is switched at a high speed, the following phenomenon occurs: impact ionization occurs in the high-side side IGBT and carriers (holes) are discharged to a front surface side of the semiconductor substrate.

That is, when an emitter potential is applied to the emitter electrode, a body diode operates and a large number of carriers are generated in the semiconductor substrate. In this state, when a collector potential is applied to a collector region, holes are discharged to an upper surface side of the semiconductor substrate. When the collector potential is raised, a depletion layer becomes difficult to spread in the semiconductor substrate due to residual carriers. When the collector potential is further raised, an inside of the semiconductor substrate becomes a high electric field and the impact ions are generated. The impact ionized holes are discharged to a front surface side of the semiconductor substrate.

At this time, a high voltage drop occurs in a p-type well region near the resistance element for a gate pad. There is a problem in that this high voltage drop causes dielectric breakdown in a silicon oxide film formed under the resistance element. Therefore, there is a problem in that reliability of the semiconductor device decreases.

Other problems and novel features will be apparent from the description of the present specification and the accompanying drawings.

The following is a brief description of an outline of the typical invention disclosed in the present application.

A semiconductor device according to one embodiment includes: a semiconductor substrate of a first conductivity type, the semiconductor substrate having an upper surface and a lower surface; a well region of a second conductivity type opposite to the first conductivity type, the well region being formed in the semiconductor substrate on an upper surface side of the semiconductor substrate; a first insulating film and a second insulating film formed on the well region; a first resistance element formed on the first insulating film; a second resistance element formed on the second insulating film; an interlayer insulating film formed on the upper surface of the semiconductor substrate so as to cover the first resistance element and the second resistance element; a gate pad formed on the interlayer insulating film and connected to an external connection member; an emitter electrode formed on the interlayer insulating film; and a gate wiring formed on the interlayer insulating film, located between the gate pad and the emitter electrode, and extending in a first direction in a plan view. The first resistance element and the second resistance element are each formed to overlap a portion of each of the gate pad and the gate wiring in the plan view, and are electrically connected to the gate pad and the gate wiring; the well region overlaps a portion of each of the first insulating film, the second insulating film, the first resistance element, the second resistance element, the gate pad, the gate wiring, and the emitter electrode in the plan view; the emitter electrode includes a convex portion that protrudes toward a gate pad side in a second direction perpendicular to the first direction in the plan view; the convex portion is located between the first resistance element and the second resistance element in the plan view; and the convex portion and the well region are electrically connected via a hole formed in the interlayer insulating film.

A method of manufacturing a semiconductor device according to one embodiment includes: (a) preparing a semiconductor substrate of a first conductivity type, the semiconductor substrate having an upper surface and a lower surface; (b) forming a first insulating film and a second insulating film on the upper surface of the semiconductor substrate; (c) forming a well region of a second conductivity type in the semiconductor substrate on an upper surface side of the semiconductor substrate, the second conductivity type being opposite to the first conductivity type; (d) forming a first resistance element on the first insulating film, and forming a second resistance element on the second insulating film; (e) forming an interlayer insulating film on the upper surface of the semiconductor substrate so as to cover the first resistance element and the second resistance element; (f) forming a hole in the interlayer insulating film, the hole reaching the well region; and (g) forming a gate pad, an emitter electrode, and a gate wiring for connection to an external connection member on the interlayer insulating film. The gate wiring is located between the gate pad and the emitter electrode, and extends in a first direction in a plan view; the first resistance element and the second resistance element are each formed so as to overlap a portion of each of the gate pad and the gate wiring in a plan view, and are electrically connected to the gate pad and the gate wiring; the well region overlaps a portion of each of the first insulating film, the second insulating film, the first resistance element, the second resistance element, the gate pad, the gate wiring, and the emitter electrode in the plan view; the emitter electrode includes a convex portion that protrudes toward a gate pad side in a second direction perpendicular to the first direction in the plan view; the convex portion is located between the first resistance element and the second resistance element in the plan view; and the convex portion and the well region are electrically connected via the hole.

According to one embodiment, the reliability of the semiconductor device can be improved.

BRIEF DESCRIPTION OF THE DRAWINGS

FIG. 16 is a cross-sectional view showing the manufacturing process following FIG. 15.

DETAILED DESCRIPTION

Figure 1:
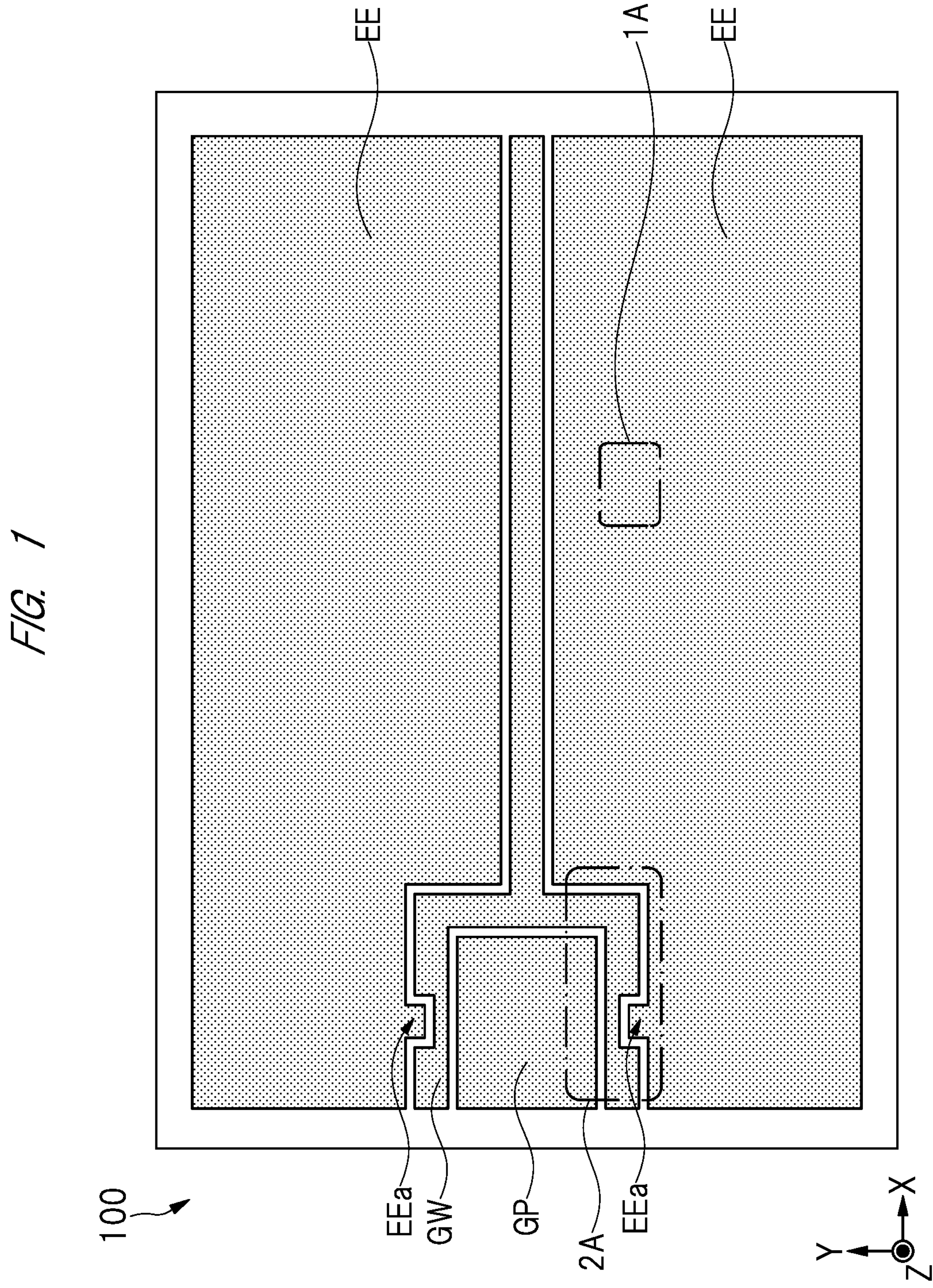
FIG. 1 is a plan view showing the entirety of a semiconductor device according to a first embodiment.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

First Embodiment

Structure of Semiconductor Device

A semiconductor device 100 according to a first embodiment will be described below with reference to FIGS. 1 to 5. FIG. 1 is a plan view showing a semiconductor chip that is a semiconductor device 100.

As shown in FIG. 1, an upper surface of a semiconductor device 100 is covered with an emitter electrode EE, a gate pad GP, and a gate wiring GW. A plurality of cells configuring an IGBT are formed at a lower portion of the emitter electrode EE. The gate wiring GW is formed around the gate pad GP. The gate pad GP and the gate wiring GW are electrically connected via a resistance element Rg, which will be described later. A portion of the gate wiring GW crosses a center of the semiconductor device 100 so as to be capable of supplying a gate potential to the plurality of cells.

Although not shown in the figures, the emitter electrode EE, the gate pad GP, and the gate wiring GW are covered with a protective film such as a polyimide film. An opening is formed in the protective film over a portion of each of the emitter electrode EE and gate pad GP. External connection terminals are connected to respective portions of the emitter electrode EE and gate pad GP exposed from the opening, so that the semiconductor device 100 is electrically connected to a lead frame, another semiconductor chip, a wiring board, or the like. Note that the external connection terminal is a wire bonding made of gold, copper, or aluminum, or a clip made of a copper plate.

The semiconductor device 100 includes a region 1A and a region 2A that are different from each other. The region 1A is a cell region where the plurality of cells configuring the IGBT are formed. The region 2A is a resistance element region where the resistance element Rg is formed.

A main feature of the first embodiment is in that a convex portion EEa is formed on the emitter electrode EE of the region 2A, and the convex portion EEa is electrically connected to a well region PW directly below the convex portion EEa. Such a feature will be explained in detail later.

Structure of IGBT

Figure 2:
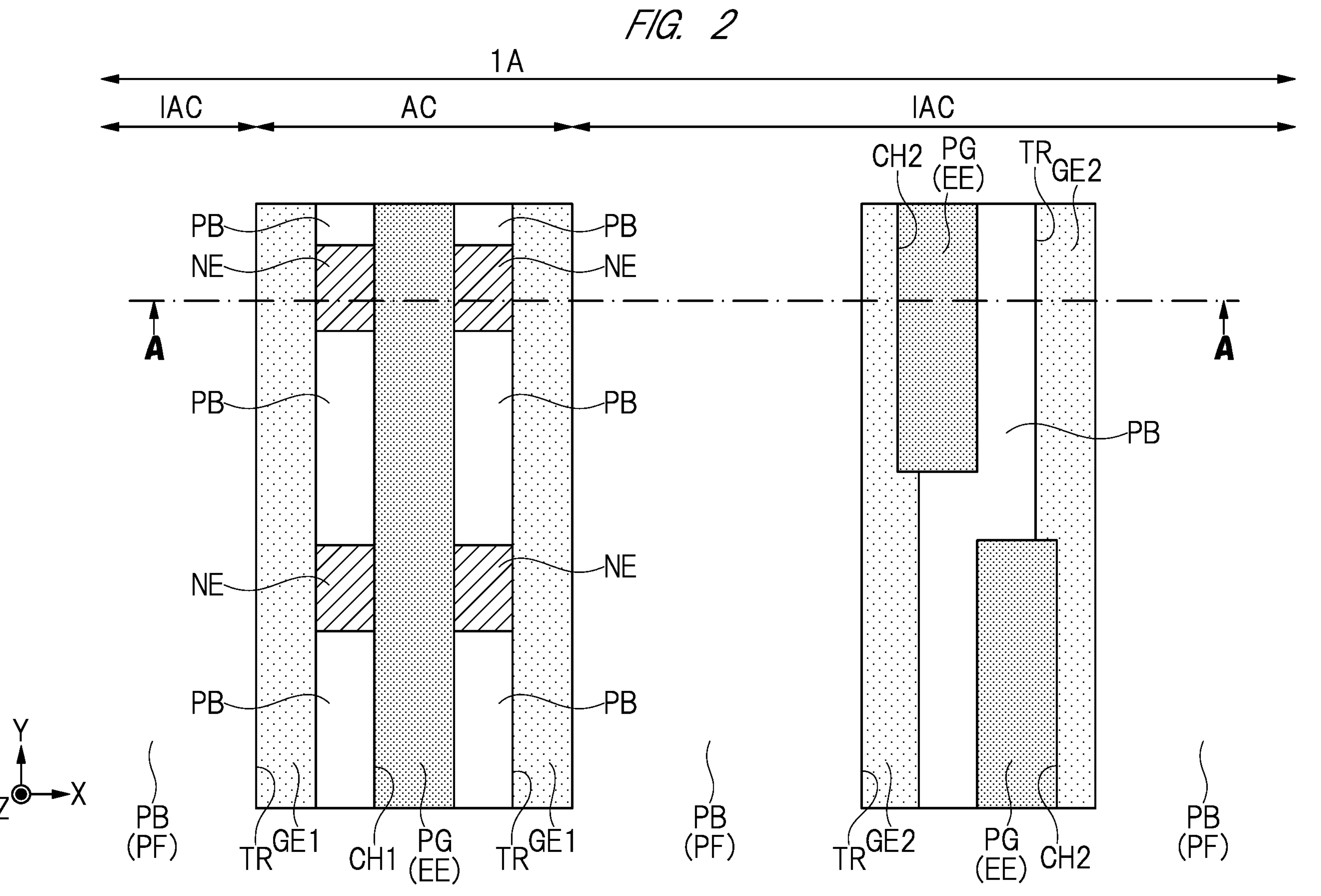
FIG. 2 is a plan view showing a main portion of the semiconductor device according to the first embodiment.
Figure 3:
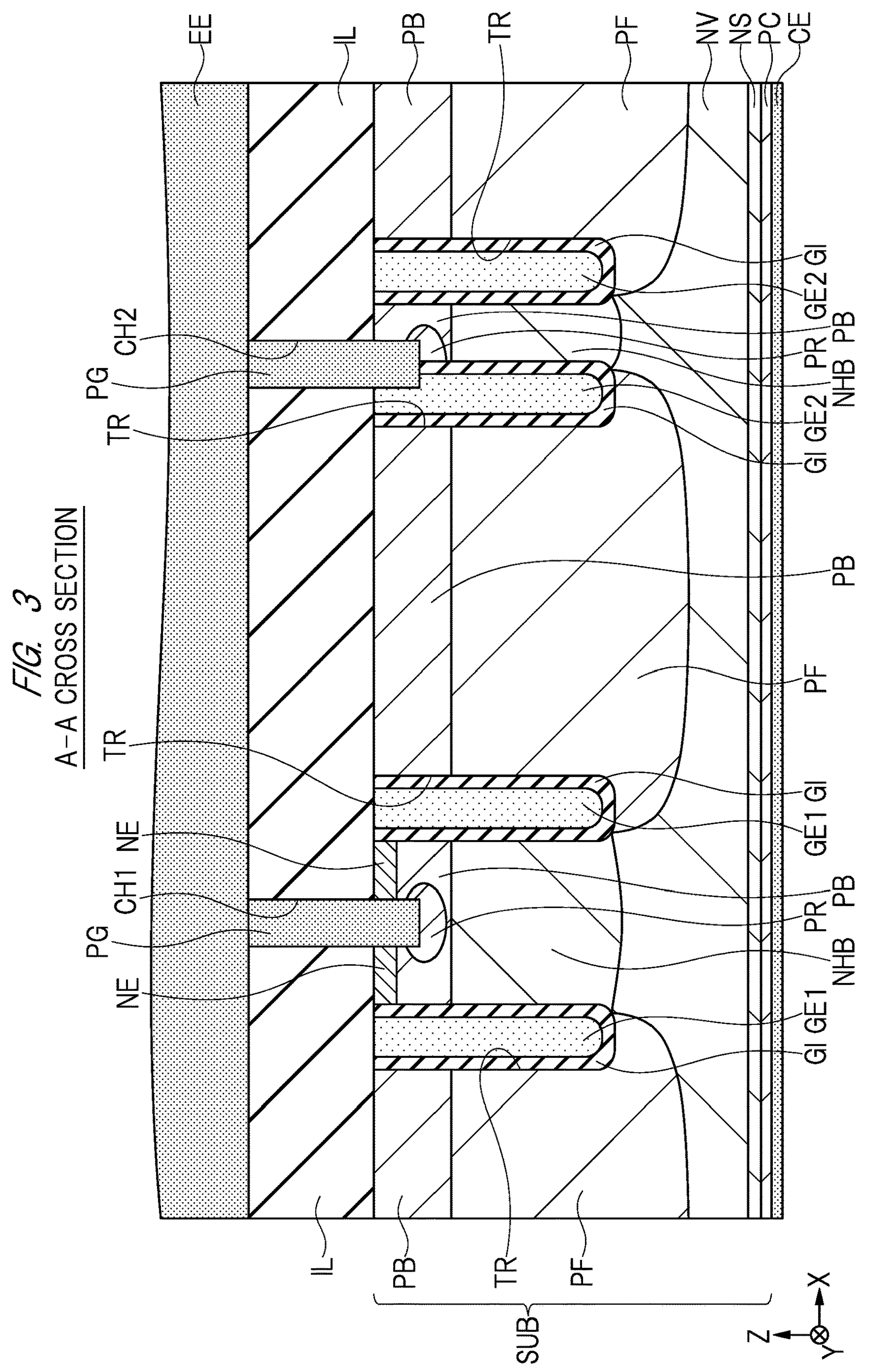
FIG. 3 is a cross-sectional view showing the semiconductor device according to the first embodiment.

FIG. 2 is a plan view of a main portion corresponding to the region 1A. FIG. 3 is a cross-sectional view taken along line A-A in FIG. 2. The region 1A of the semiconductor device 100 has an active cell AC for performing a main operation of the IGBT and an inactive cell IAC other than the active cell AC.

As shown in FIG. 2, a plurality of trenches TR extend in a Y direction and are adjacent to each other in an X direction. A gate electrode GE1 is formed inside the trench TR of the active cell AC. A gate electrode GE2 is formed in the trench TR of the inactive cell IAC. A gate trench is configured by the trench TR formed in the active cell AC and the gate electrode GE1 formed in the trench TR. An emitter trench is configured by the trench TR formed in the inactive cell IAC and the gate electrode GE2 formed in the trench TR.

The gate wiring GW is electrically connected to the gate electrode GE1 of the active cell AC, and a gate potential is supplied during an operation of the IGBT. An emitter electrode EE is electrically connected to the gate electrode GE2 of the inactive cell IAC, and an emitter potential is supplied during the operation of the IGBT. Furthermore, the emitter electrode EE is electrically connected to a base region PB and an emitter region NE of the active cell AC and a base region PB of the inactive cell IAC, and an emitter potential is supplied during the operation of the IGBT.

As shown in FIG. 3, the semiconductor device 100 includes an n-type semiconductor substrate SUB having an upper surface and a lower surface. The semiconductor substrate SUB is made of n-type silicon and has a drift region NV. Here, the n-type semiconductor substrate SUB itself configures the drift region NV. Note that the semiconductor substrate SUB may be a laminated body of an n-type silicon substrate and an n-type silicon layer grown on the silicon substrate while introducing phosphorus (P) by an epitaxial growth method. In that case, the n-type silicon layer having a lower impurity concentration than that of the n-type silicon substrate configures the drift region NV.

On a lower surface side of the semiconductor substrate SUB, an n-type field stop region (impurity region) NS is formed in the semiconductor substrate SUB. An impurity concentration in the field stop region NS is higher than an impurity concentration in the drift region NV. The field stop region NS is provided to suppress a depletion layer extending from a pn junction on an upper surface side of the semiconductor substrate SUB from reaching a p-type collector region PC during turn-off of the IGBT.

On the lower surface side of the semiconductor substrate SUB, the p-type collector region (impurity region) PC is formed in the semiconductor substrate SUB. The collector region PC is located below the field stop region NS.

A collector electrode CE is formed under the lower surface of the semiconductor substrate SUB. The collector electrode CE is electrically connected to the collector region PC and supplies a collector potential to the collector region PC. The collector electrode CE is, for example, a single-layer metal film such as an Au film, a Ni film, a Ti film, or an AlSi film, or a laminated metal film in which these are appropriately laminated. Note that the field stop region NS, the collector region PC, and the collector electrode CE are formed over the entire semiconductor substrate SUB, including not only the region 1A but also the region 2A.

The trench TR is formed in the semiconductor substrate SUB on the upper surface side of the semiconductor substrate SUB. The trench TR penetrates through the emitter region NE and the base region PB, which will be described later, and reaches an inside of the semiconductor substrate SUB. A depth of the trench TR is, for example, 2 μm or more and 5 μm or less.

A gate insulating film GI is formed inside the trench TR. The gate electrodes GE1 and GE2 are embedded into the trench TR via the gate insulating film GI. The gate insulating film GI is, for example, a silicon oxide film. The gate electrodes GE1 and GE2 are conductive films, for example, polycrystalline silicon films introducing n-type impurities. A thickness of the gate insulating film GI is, for example, 70 nm or more and 150 nm or less.

On the upper surface side of the semiconductor substrate SUB in the active cell AC, a hole barrier region (impurity region) NHB is formed in the semiconductor substrate SUB between a pair of trenches TR (a pair of gate electrodes GE1). An impurity concentration of the hole barrier region NHB is higher than an impurity concentration of the drift region NV.

A p-type base region (impurity region) PB is formed in the hole barrier region NHB. An n-type emitter region (impurity region) NE is formed in the p-type base region PB. An impurity concentration of the emitter region NE is higher than the impurity concentration of the drift region NV. The base region PB is formed so as to be shallower than a depth of the trench TR, and the emitter region NE is formed so as to be shallower than a depth of the base region PB.

Note that, as shown in FIG. 2, the plurality of emitter regions NE are formed between the pair of trenches TR (the pair of gate electrodes GE1), and are formed so as to be spaced apart from each other by a predetermined distance along the Y direction. The base region PB located below the emitter region NE adjacent to the gate electrode GE1 is used as a channel region.

On the upper surface side of the semiconductor substrate SUB in the inactive cell IAC, the hole barrier region NHB is formed in the semiconductor substrate SUB between the pair of trenches TR (the pair of gate electrodes GE2). Furthermore, a p-type floating region (impurity region) PF is formed in the semiconductor substrate SUB between the gate electrode GE1 and the gate electrode GE2. That is, the floating region PF is formed in the semiconductor substrate SUB in the region 1A other than between the pair of trenches TR. The p-type base region PB is formed in the hole barrier region NHB and in the floating region PF. An impurity concentration of the base region PB is lower than an impurity concentration of the floating region PF.

The floating region PF and the base region PB formed in the floating region PF are not electrically connected to the gate wiring GW and the emitter electrode EE and are electrically in a floating state.

In the active cell AC and the inactive cell IAC, an interlayer insulating film IL is formed on the upper surface of the semiconductor substrate SUB so as to cover each trench TR. The interlayer insulating film IL is, for example, a silicon oxide film. A thickness of the interlayer insulating film IL is, for example, 600 nm or more and 1500 nm or less.

Further, the interlayer insulating film IL is subjected to a flattening treatment to flatten an upper surface of the interlayer insulating film IL.

In the active cell AC, a hole CH1 penetrates through the interlayer insulating film IL and the emitter region NE, and reaches an inside of the base region PB. The hole CH1 is formed so as to have contact with the emitter region NE and the base region PB.

In the inactive cell IAC, a hole CH2 penetrates through the interlayer insulating film IL and reaches the inside of the base region PB. Further, the hole CH2 is formed so as to overlap the gate electrode GE2 in a plan view. Therefore, the hole CH2 in the inactive cell IAC is formed so as to have contact with the gate electrode GE2 and the base region PB.

In the active cell AC and the inactive cell IAC, a p-type high concentration diffusion region (impurity region) PR is formed in the base region PB around bottom portions of the holes CH1 and the hole CH2. An impurity concentration of the high concentration diffusion region PR is higher than the impurity concentration of the base region PB. The high concentration diffusion region PR is provided mainly to reduce contact resistance with the plug PG.

The plug PG is embedded into each of the hole CH1 and the hole CH2. The plug PG includes a barrier metal film and a conductive film formed on the barrier metal film. The barrier metal film is, for example, a laminated film of a titanium film and a titanium nitride film formed on the titanium film. The conductive film is, for example, a tungsten film.

Although not shown here, the hole is also formed on a portion of the gate electrode GE1, and the plug PG is also formed in this hole.

The emitter electrode EE is formed on the interlayer insulating film IL. The emitter electrode EE is electrically connected to the emitter region NE, the base region PB, the high concentration diffusion region PR, and the gate electrode GE2 via the plug PG, and supplies the emitter potential to these regions. Note that although not shown here, the gate wiring GW and the gate pad GP, which are formed in the same manufacturing step as the emitter electrode EE, are also formed on the interlayer insulating film IL. The gate wiring GW is electrically connected to the gate electrode GE1 via the plug PG, and supplies the gate potential to the gate electrode GE1.

The above-mentioned emitter electrode EE, gate wiring GW, and gate pad GP each include the barrier metal film and the conductive film formed on the barrier metal film. The barrier metal film is, for example, a TiW film. The conductive film is, for example, an aluminum alloy film to which copper or silicon is added. The aluminum alloy film is a main conductor film of the emitter electrode EE and the gate wiring GW, and is sufficiently thicker than the TiW film.

Structure of Resistance Element and its Periphery

Figure 4:
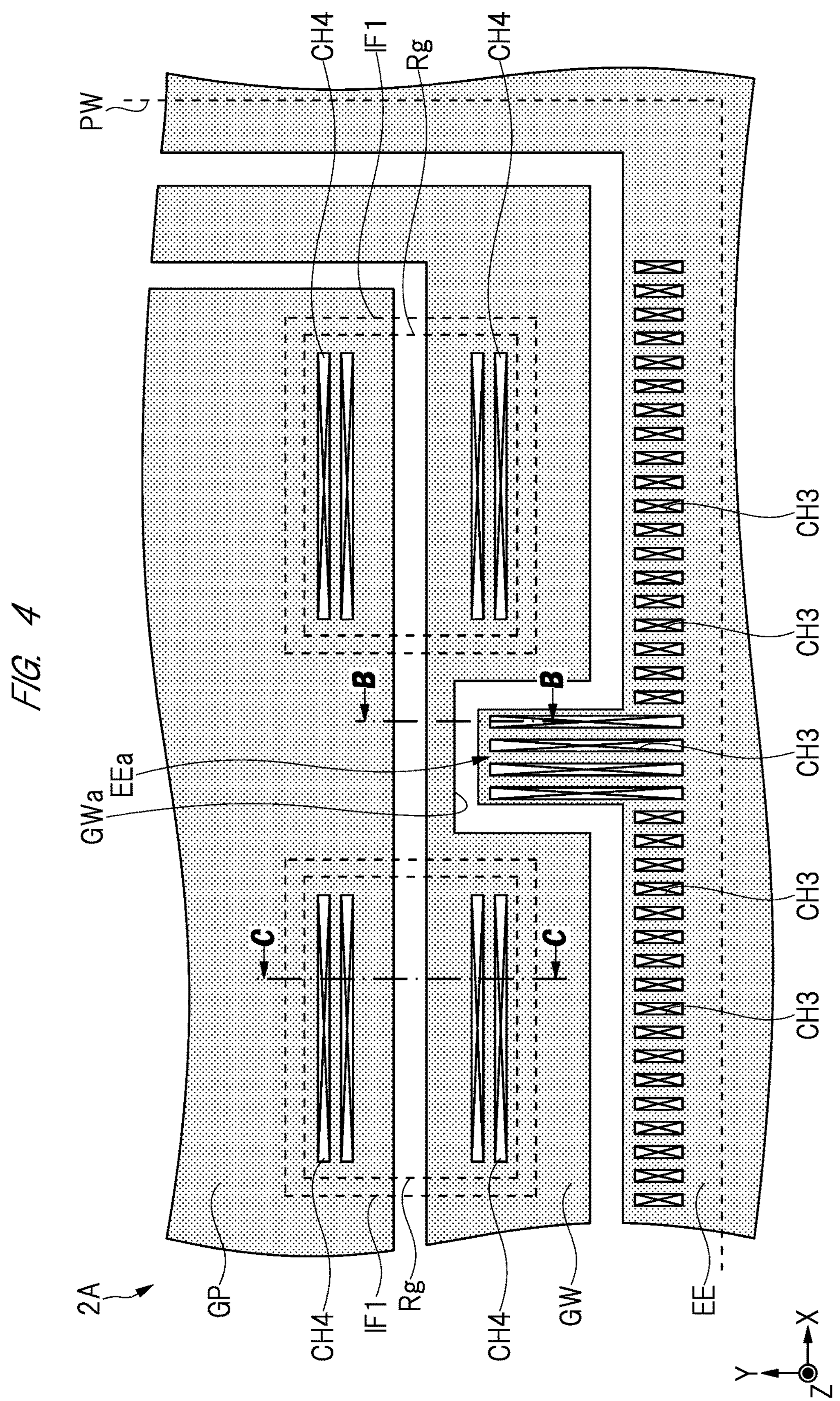
FIG. 4 is a plan view showing the main portion of the semiconductor device according to the first embodiment.
Figure 5:
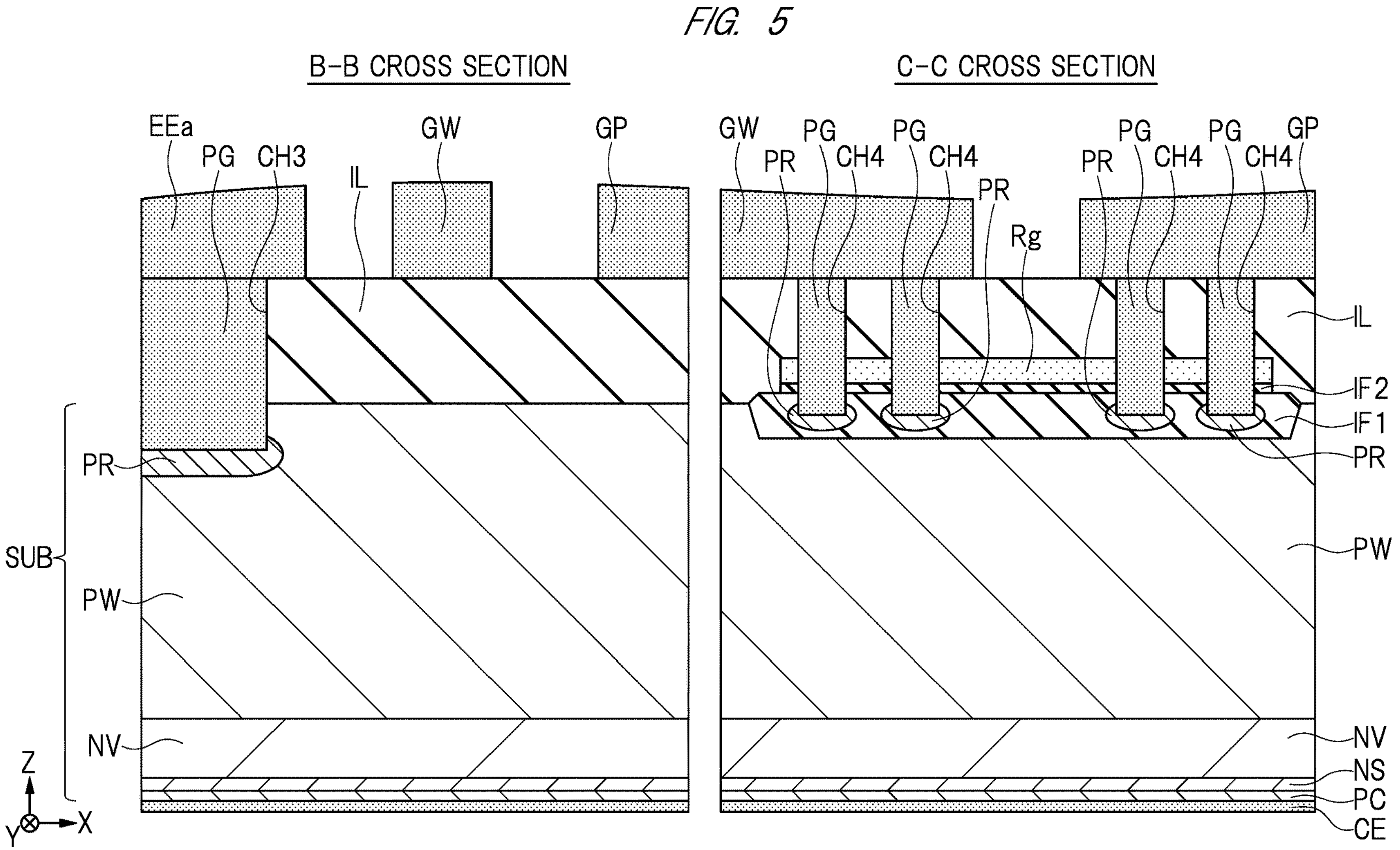
FIG. 5 is a cross-sectional view showing the semiconductor device according to the first embodiment.

FIG. 4 is a plan view of a main portion corresponding to the region 2A. FIG. 5 is a cross-sectional view taken along line B-B in FIG. 4 and a cross-sectional view taken along line C-C in FIG. 4. Note that although FIG. 4 shows a structure near one end portion of the gate pad GP in the Y direction, a structure near the other end portion of the gate pad GP in the Y direction is an inverted structure of FIG. 4.

As shown in FIG. 5, a p-type well region (impurity region) PW is formed in the semiconductor substrate SUB on the upper surface side of the semiconductor substrate SUB. Although the well region PW is formed in the same step as the floating region PF of the region 1A, it is physically separated from the floating region PF.

An insulating film IF1 is formed on the well region PW. The insulating film IF1 is formed correspondingly to a region where the resistance element Rg is formed, and is provided to ensure a dielectric withstand voltage between the resistance element Rg and the well region PW. The insulating film IF1 is, for example, a silicon oxide film. A thickness of the insulating film IF1 is, for example, 300 nm or more and 600 nm or less.

The resistance element Rg is formed on the insulating film IF1 via an insulating film IF2. The insulating film IF2 is, for example, a silicon oxide film. A thickness of the insulating film IF2 is, for example, 50 nm or more and 100 nm or less. The resistance element Rg is, for example, a polycrystalline silicon film introducing n-type impurities. A thickness of the resistance element Rg is, for example, 150 nm or more and 250 nm or less.

In the region 2A, the interlayer insulating film IL is formed on the upper surface of the semiconductor substrate SUB so as to cover the resistance element Rg. A plurality of holes CH4 are formed in the interlayer insulating film IL in the region 2A. The hole CH4 is formed to penetrate through the interlayer insulating film IL and the resistance element Rg and reach the insulating film IF1. The high concentration diffusion region PR is formed around a bottom portion of the hole CH4. The plug PG is embedded into the hole CH4. Note that the hole CH4 may not penetrate through the resistance element Rg, and the bottom portion of the hole CH4 may be located in the resistance element Rg. Further, the hole CH4 has a shape in which an opening width in the X direction is larger than the opening width in the Y direction.

As shown in FIG. 4, in the first embodiment, two resistance elements Rg are formed on two insulating films IF1, respectively. The insulating film IF1 encloses the resistance element Rg in a plan view. The two resistance elements Rg are formed so as to overlap a portion of each of the gate pad GP and the gate wiring GW in a plan view.

One end portion of the resistance element Rg is electrically connected to the gate pad GP via the hole CH4 (plug PG). The other end portion of the resistance element Rg is electrically connected to the gate wiring GW via the hole CH4 (plug PG). That is, by configuring a halfway portion of an electrical path from the gate pad GP to the gate wiring GW with the resistance element Rg, the resistance element Rg can be used as a gate built-in resistor.

The gate wiring GW is located between the gate pad GP and the emitter electrode EE. A concave portion GWa is provided in a portion of the gate wiring GW extending in the X direction. The emitter electrode EE includes a convex portion EEa that protrudes toward a gate pad GP side in the Y direction so as to fit into a shape of the concave portion GWa. The convex portion EEa is located between the two resistance elements Rg in a plan view.

As shown in FIGS. 4 and 5, the well region PW is formed so as to overlap a portion of each of the insulating film IF1, the resistance element Rg, the gate pad GP, the gate wiring GW, and the emitter electrode EE in a plan view.

A plurality of holes CH3 are formed in the region 2A. The hole CH3 is formed so as to penetrate through the interlayer insulating film IL and reach the well region PW. The plug PG is embedded into the hole CH3. The high concentration diffusion region PR is formed in the well region PW around the bottom portion of the hole CH3. Further, the hole CH3 has a shape in which an opening width in the Y direction is larger than the opening width in the X direction.

The convex portion EEa and the well region PW are electrically connected via the plurality of holes CH3 (a plurality of plugs PG) formed in the interlayer insulating film IL. The emitter potential is supplied to the well region PW from the emitter electrode EE and the convex portion EEa.

Note that the number of holes CH3 and the number of holes CH4 are not limited to the number shown in FIG. 4, and can be set appropriately.

Main Features of First Embodiment

Main features of the first embodiment will be explained below with reference to FIGS. 6 to 9. As described above, in the semiconductor device including the IGBT, the high voltage drop occurs in the well region PW near the resistance element Rg due to the impact ions. This poses a problem in that dielectric breakdown of the insulating film IF1 formed under the resistance element Rg is caused. The convex portion EEa of the emitter electrode EE is formed to suppress such a problem.

Note that FIGS. 6 to 9 also show a potential distribution of the well region PW when an external connection member such as a bonding wire is connected to the gate pad GP and a potential is supplied to the gate pad GP.

The “reference point” shown in FIGS. 6 to 9 is a potential of the well region PW measured directly under the central portion of the gate pad GP. Moreover, the “measurement point” is a potential of the well region PW measured directly under the end portion of the resistance element Rg. Here, the potential of the “reference point” is assumed to be 100%, and the potential of the “measurement point” is calculated as a relative value with respect to the potential of the “reference point”.

Figure 6:
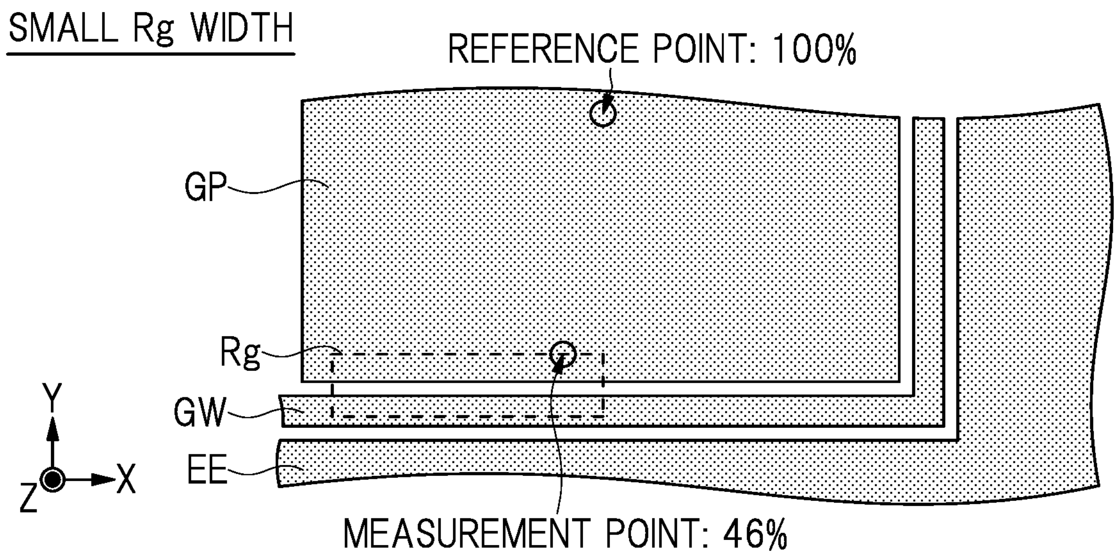
FIG. 6 is a plan view showing a potential distribution in a well region.
Figure 6:
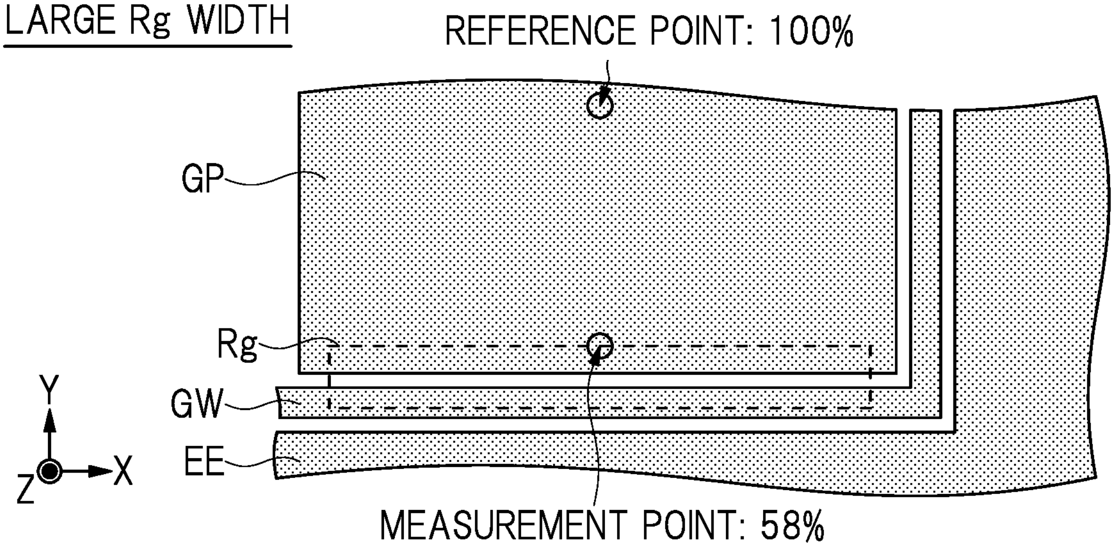

FIG. 6 shows a relationship between the width of the resistance element Rg in the X direction and the potential of the “measurement point”.

For example, a chip area of the semiconductor device 100 may be increased due to demands for higher currents in markets. In that case, parasitic capacitance (input capacitance Cies/feedback capacitance Cres) increases, so that it is necessary to improve switching characteristics, such as lowering of a resistance value of the resistance element Rg.

As one method for lowering the resistance value of the resistance element Rg, it is conceivable that the width of the resistance element Rg in the X direction is increased. For example, in “large Rg width” in FIG. 6, the width of the resistance element Rg in the X direction is approximately the same as the width of the gate pad GP in the X direction, and is 80% or more of the width of the gate pad GP in the X direction. This improves the switching characteristics.

However, as shown in FIG. 6, it has been cleared by the examination of the inventors of the present application that the larger the width of the resistance element Rg, the higher the potential at the “measurement point” and the higher the possibility of causing the dielectric breakdown of the insulating film IF1.

Figure 7:
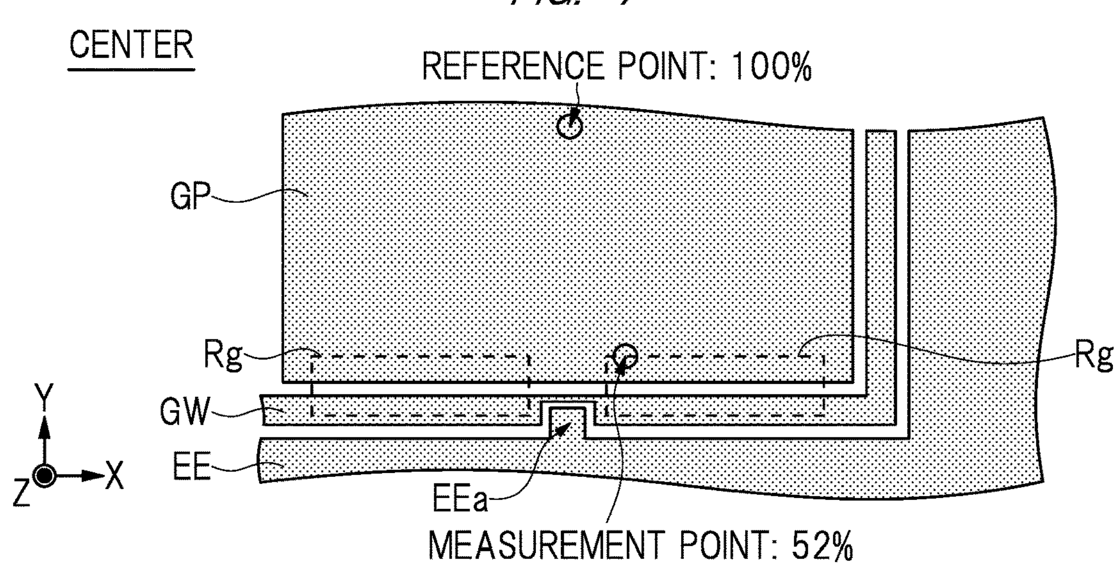
FIG. 7 is a plan view showing the potential distribution in the well region.
Figure 7:
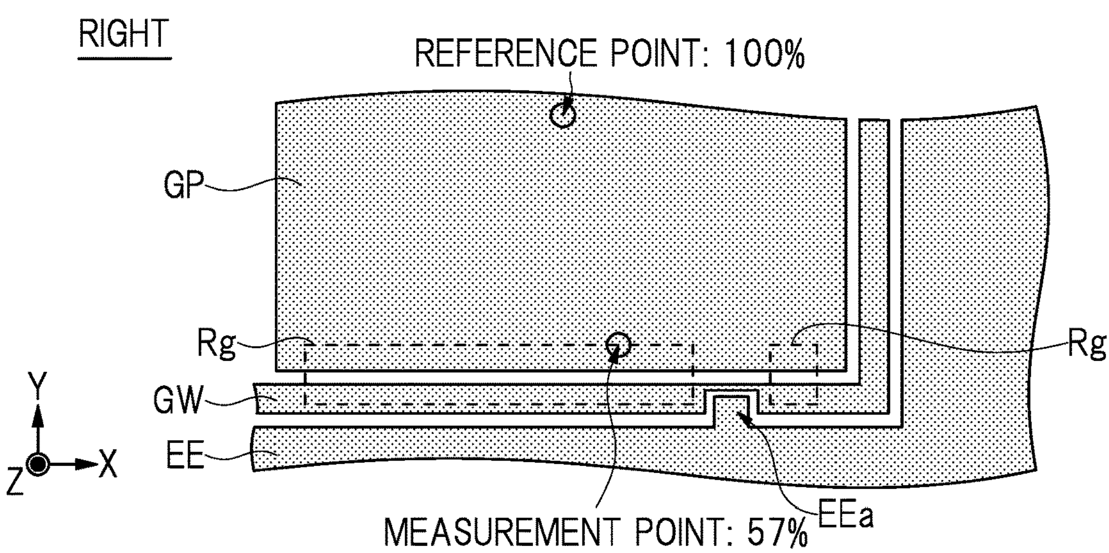
Figure 7:
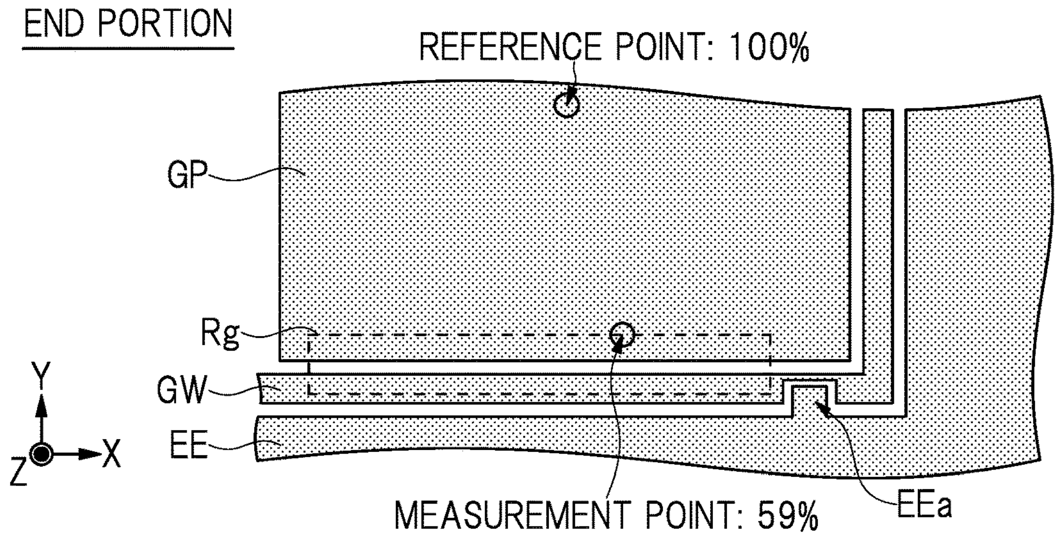

FIG. 7 shows a relationship between a position of the convex portion EEa and the potential of the “measurement point”.

In the first embodiment, the resistance element Rg is divided into two, and the convex portion EEa is provided between the two resistance elements Rg. For example, when the convex portion EEa is provided at a position close to the central portion of the gate pad GP, as in the “center” of FIG. 7, it can be seen that the potential at the “measurement point” is improved about 10% in comparison with the potential in a case of no concave portion EEa (“large Rg width” in FIG. 6). Therefore, by providing the convex portion EEa on the emitter electrode EE and electrically connecting the convex portion EEa and the well region PW, the possibility of causing the dielectric breakdown of the insulating film IF1 is reduced, and the reliability of the semiconductor device 100 can be improved.

Furthermore, when the convex portion EEa is moved away from the central portion of the gate pad GP as shown on a “right side” of FIG. 7, the potential at the “measurement point” is improved to some extent in comparison with the case no convex portion EEa, but it has been found that its effect is lower than that of the “center”.

In addition, when the resistance element Rg is not divided and the convex portion EEa is provided near the end portion of the gate pad GP as shown in the “end portion” of FIG. 7, it has been found that the potential at the “measurement point” is almost the same as that in the case of no convex portion EEa and no significant effect is obtained.

From these results, it is preferable that the convex portion EEa is provided at the position closer to the central portion of the gate pad GP than that of the end portion of the gate pad GP in the X direction.

Note that it is assumed that a technique disclosed in the first embodiment basically applies the convex portion EEa to a structure in which the width of the resistance element Rg is increased to improve the switching characteristics (“large Rg width” in FIG. 6). In the first embodiment, the resistance element Rg is divided into two, and the total width of these in the X direction is 70% or more of the width of the gate pad GP in the X direction.

Meanwhile, even when the convex portion EEa is applied to a structure in which the resistance element Rg has a small width (“small Rg width” in FIG. 6), the dielectric breakdown of the insulating film IF1 can be prevented.

Figure 8:
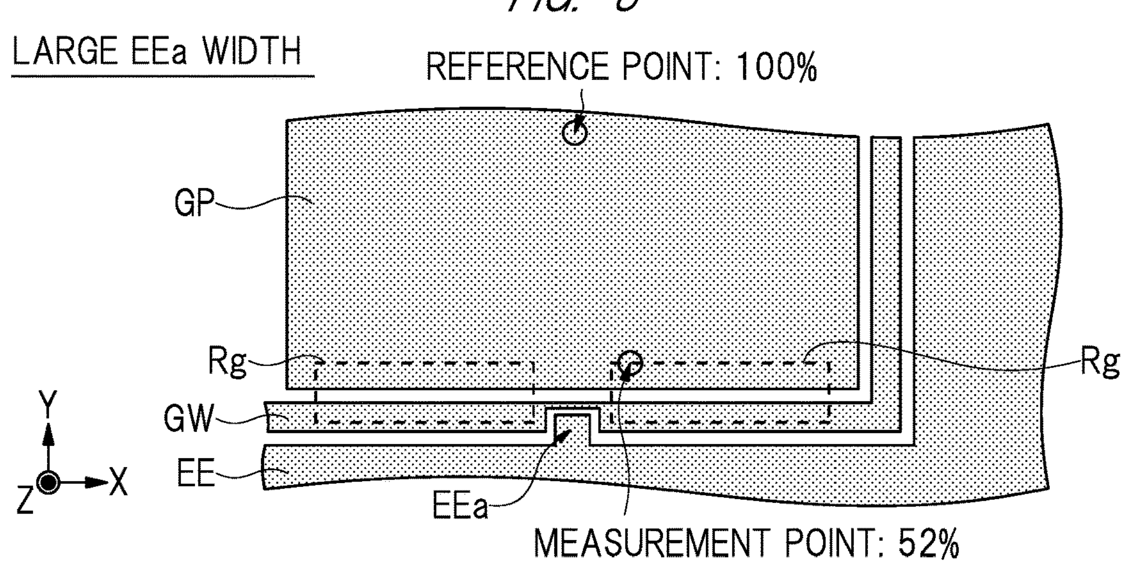
FIG. 8 is a plan view showing the potential distribution in the well region.
Figure 8:
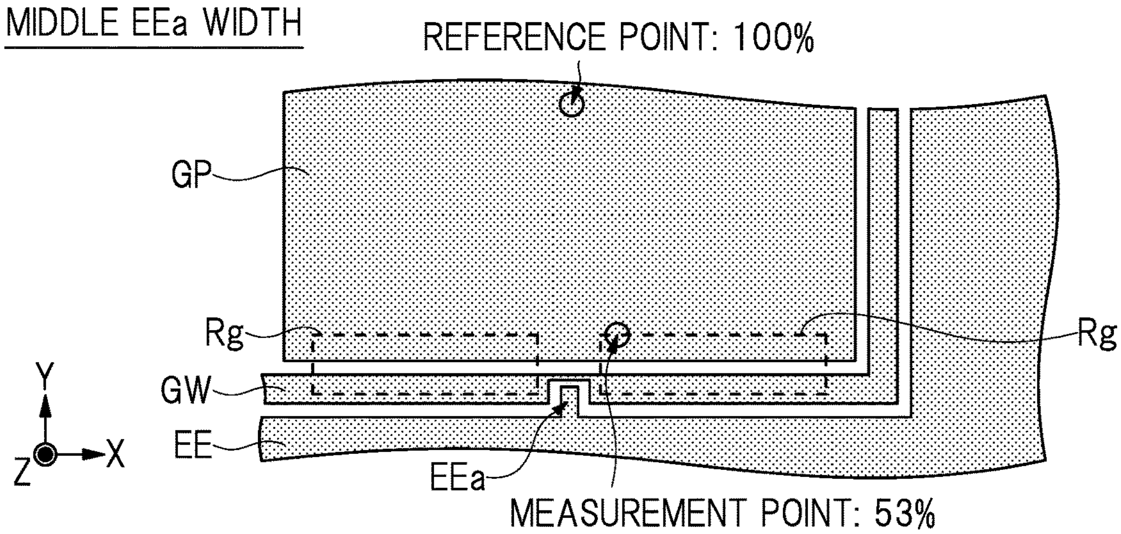
Figure 8:
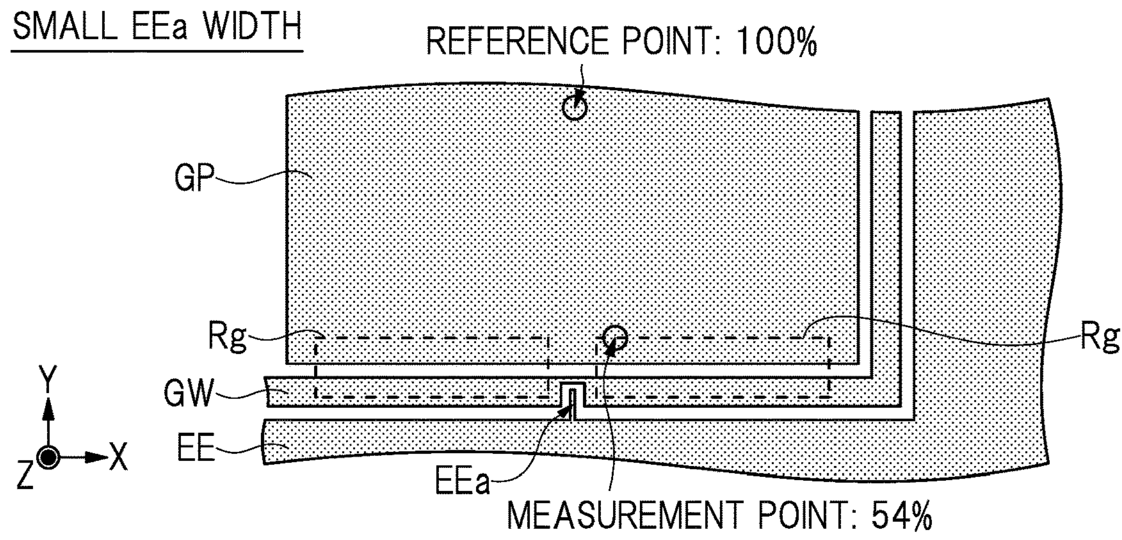

FIG. 8 shows a relationship between the width of the convex portion EEa in the X direction and the potential at the “measurement point”.

As shown in FIG. 8, it can be seen that as the width of the convex portion EEa is made smaller, the potential at the “measurement point” becomes slightly higher. Therefore, from the viewpoint of preventing the dielectric breakdown of the insulating film IF1, it is preferable that the width of the convex portion EEa is as large as possible.

However, increasing the width of the convex portion EEa means that the entirety of the width of the resistance element Rg becomes smaller and the effect of improving the switching characteristics becomes smaller. Further, as shown in results of FIG. 8, a change in the potential at the “measurement point” due to the width of the convex portion EEa is not so large. Therefore, if the dielectric breakdown of the insulating film IF1 can be sufficiently prevented, it is preferable that the width of the convex portion EEa is as small as possible.

Figure 9:
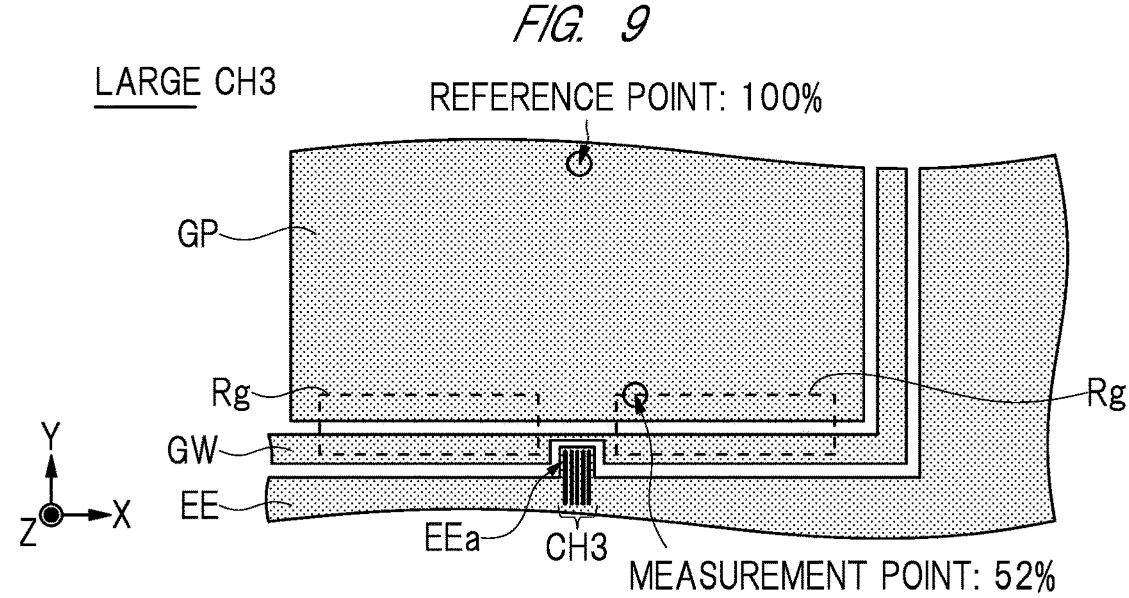
FIG. 9 is a plan view showing the potential distribution in the well region.
Figure 9:
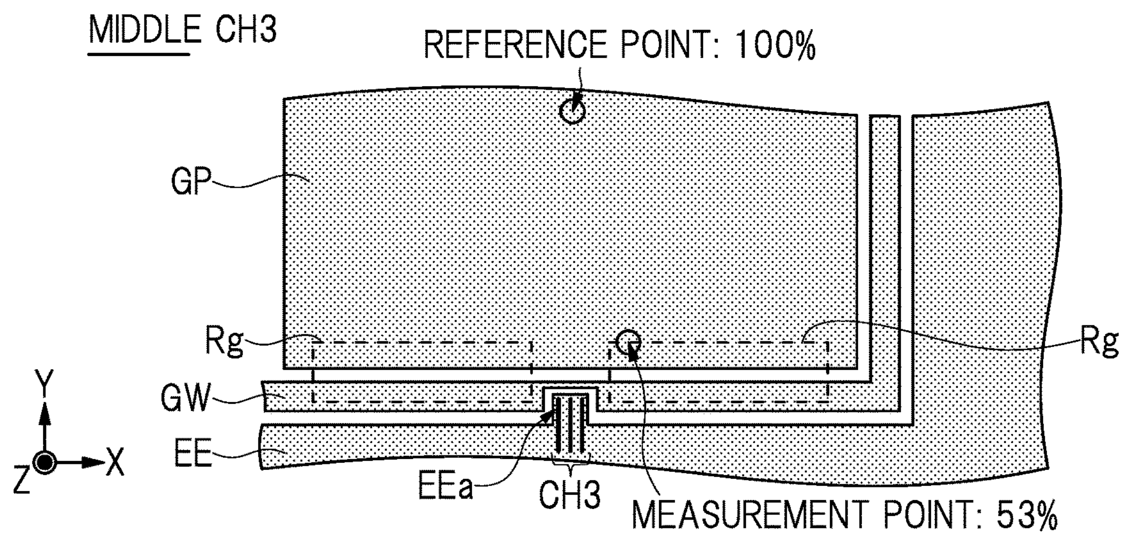
Figure 9:
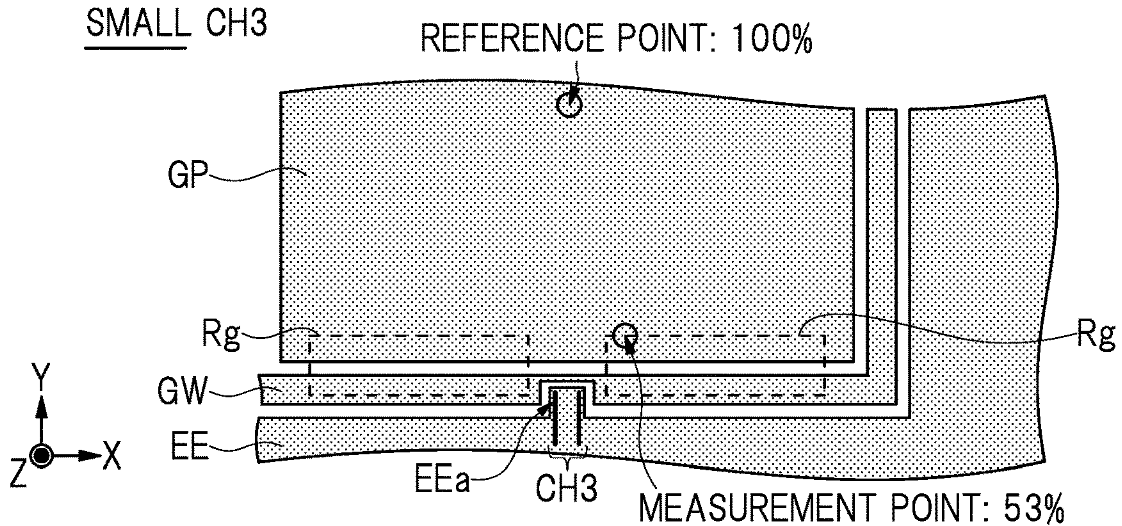

FIG. 9 shows a relationship between the number of holes CH3 and the potential at the “measurement point”.

As shown in FIG. 9, it can be seen that as the number of holes CH3 is smaller, the potential at the “measurement point” becomes slightly higher. Therefore, from the viewpoint of preventing the dielectric breakdown of the insulating film IF1, it is preferable that the number of holes CH3 is as large as possible.

However, for the same reason as in FIG. 8, if the width of the convex portion EEa is increased in order to increase the number of holes CH3, the entirety of the width of the resistance element Rg becomes smaller. Therefore, it is preferable to provide as many holes CH3 as possible with respect to the width of the convex portion EEa to such a degree that the dielectric breakdown of the insulating film IF1 can sufficiently be prevented.

Method of Manufacturing Semiconductor Device

Each manufacturing steps included in a method of manufacturing the semiconductor device 100 according to the first embodiment will be described below with reference to FIGS. 10 to 28. Note that, in the following, basically, a drawing of an A-A cross section (the drawing of the region 1A) and a drawing of a B-B cross section and a C-C cross section (the drawing of the region 2A) will be explained in parallel. However, in cases where a cross-sectional structure of one side is almost unchanged, the drawing of one side will be omitted.

Figure 10:
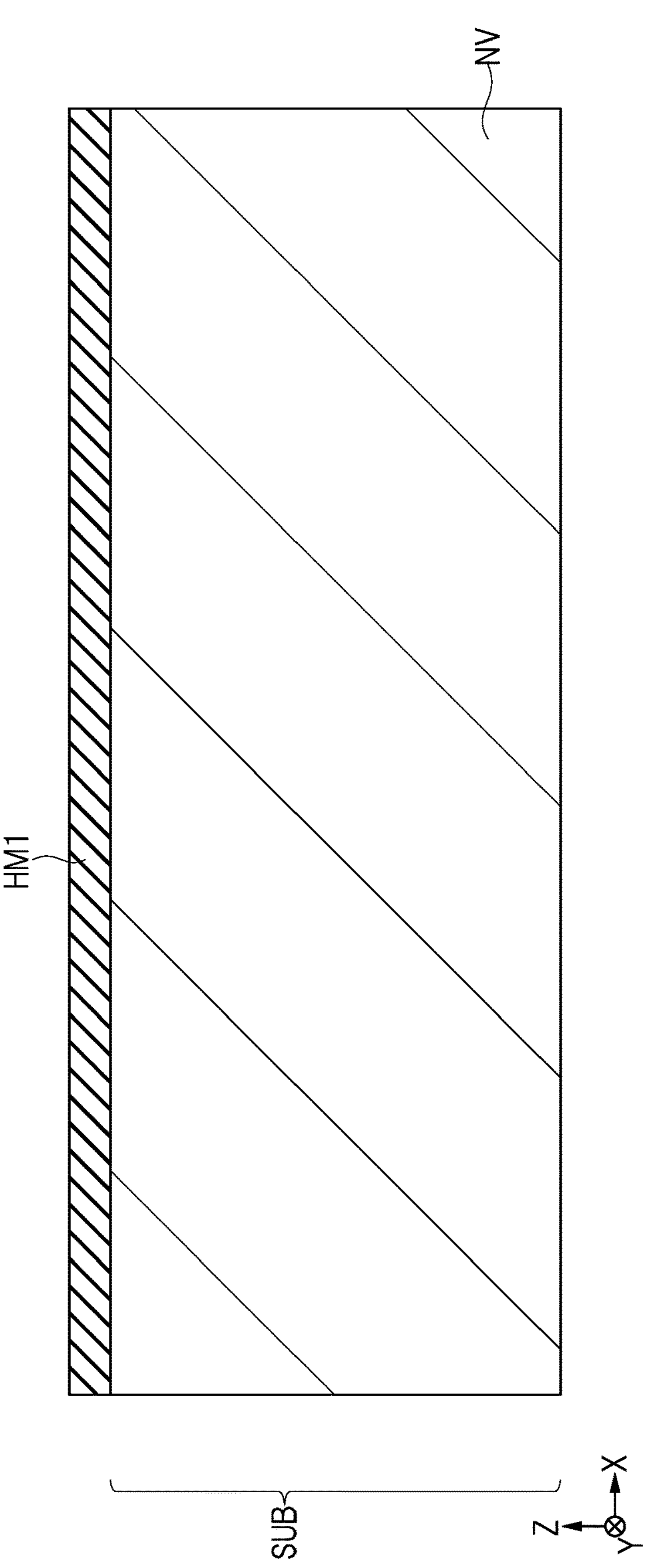
FIG. 10 is a cross-sectional view showing a manufacturing process of the semiconductor device according to the first embodiment.
Figure 11:
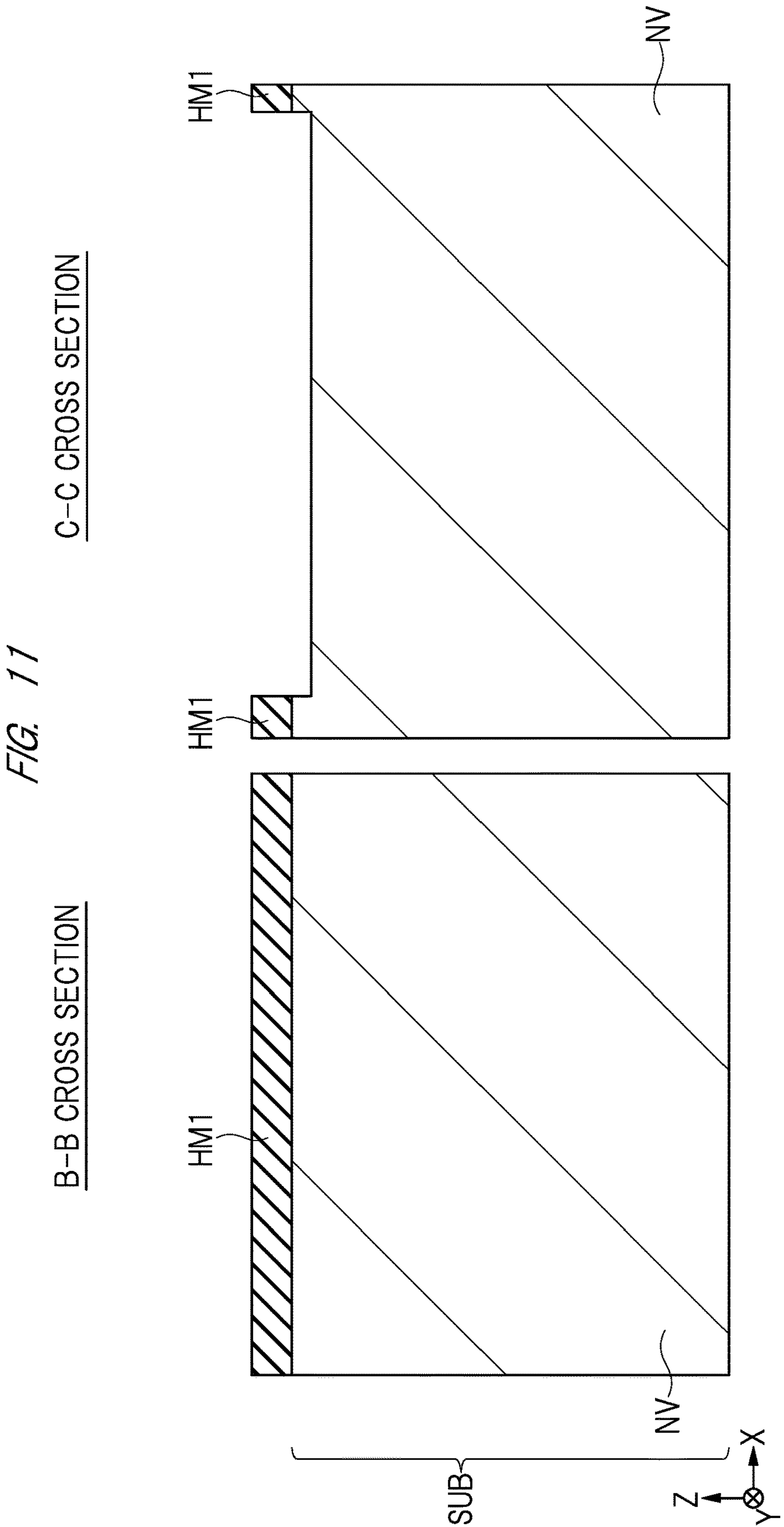
FIG. 11 is a cross-sectional view showing the manufacturing process of the semiconductor device according to the first embodiment.

First, as shown in FIGS. 10 and 11, a semiconductor substrate SUB having an n-type drift region NV is prepared. The semiconductor substrate SUB is made of n-type silicon. Note that, as described above, the semiconductor substrate SUB may be a laminated body of an n-type silicon substrate and an n-type silicon layer grown on the silicon substrate by an epitaxial growth method while introducing phosphorus (P).

Next, a hard mask HM1 is formed on an upper surface of the semiconductor substrate SUB so as to selectively cover the upper surface of the semiconductor substrate SUB. In order to form such a hard mask HM1, first, a silicon oxide film is formed on the upper surface of the semiconductor substrate SUB in the region 1A and the region 2A by, for example, a thermal oxidation method. Next, a silicon nitride film is formed on the silicon oxide film by, for example, a CVD method. Next, the above-mentioned silicon nitride film and silicon oxide film in the region 2A are selectively removed by a photolithographic technique and an anisotropic etching processing. As a result, the hard mask HM1 is formed.

Next, by using the hard mask HM1 as a mask to perform an anisotropic etching processing, the upper surface of the semiconductor substrate SUB exposed from the hard mask HM1 is retreated.

Figure 12:
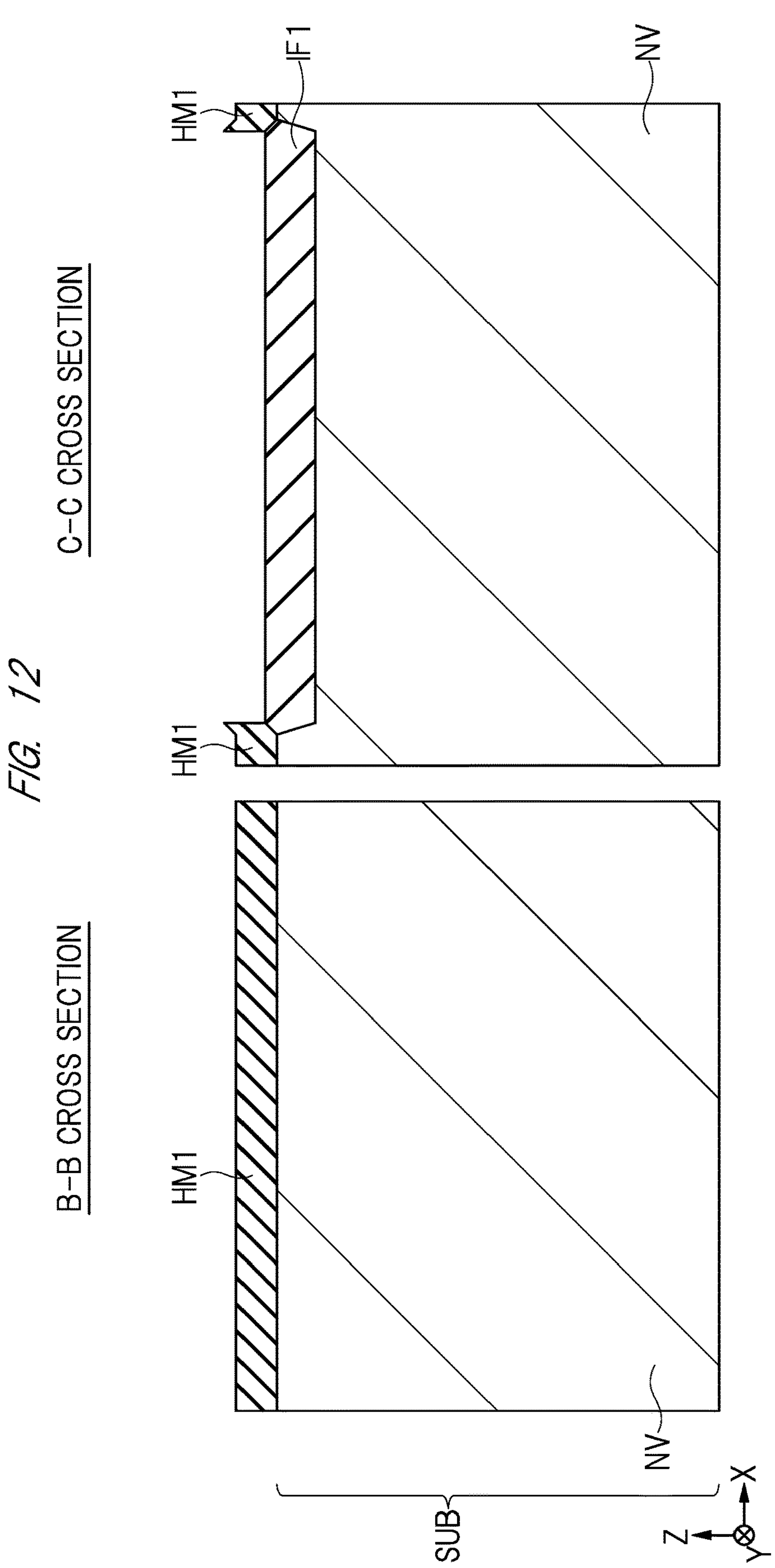
FIG. 12 is a cross-sectional view showing the manufacturing process following FIGS. 10 and 11.

As shown in FIG. 12, by performing a thermal oxidation treatment to the semiconductor substrate SUB, an insulating film IF1 is formed on the upper surface of the semiconductor substrate SUB exposed from the hard mask HM1. Consequently, the insulating film IF1 having a LOCOS structure is selectively formed on the semiconductor substrate SUB in the region 2A. Thereafter, the hard mask HM1 is removed by an isotropic etching processing.

Figure 13:
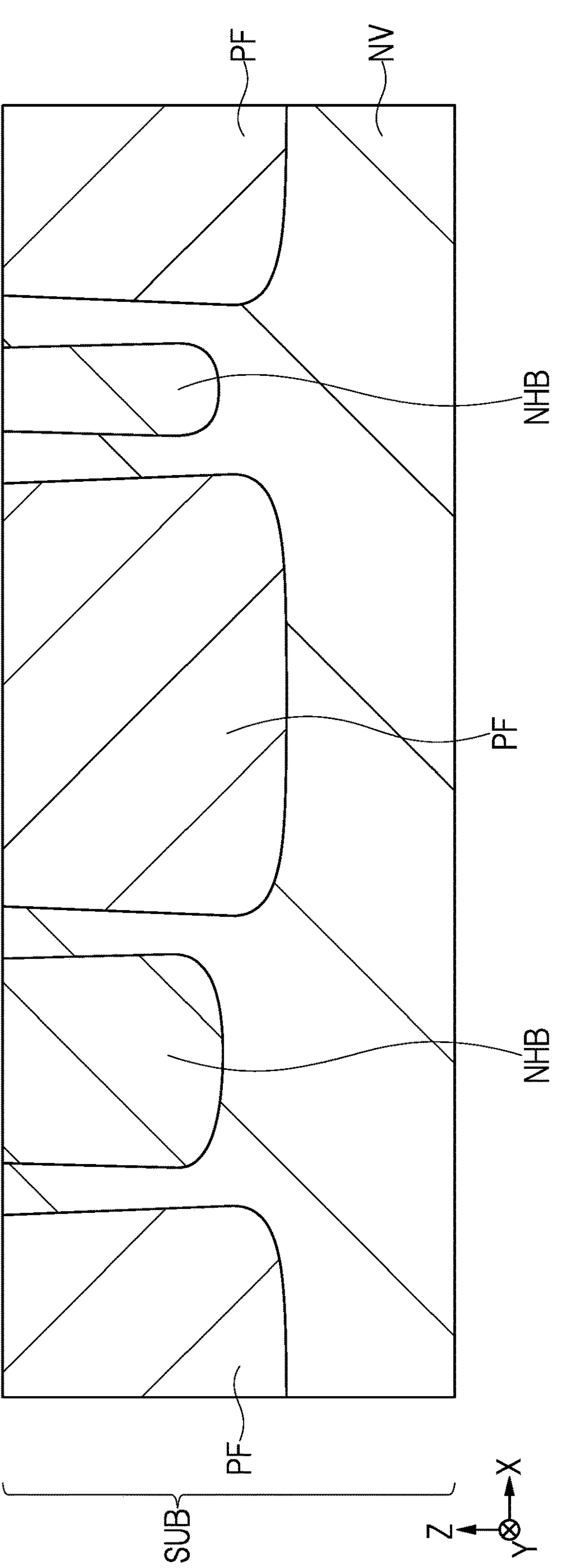
FIG. 13 is a cross-sectional view showing the manufacturing process following FIG. 12.
Figure 14:
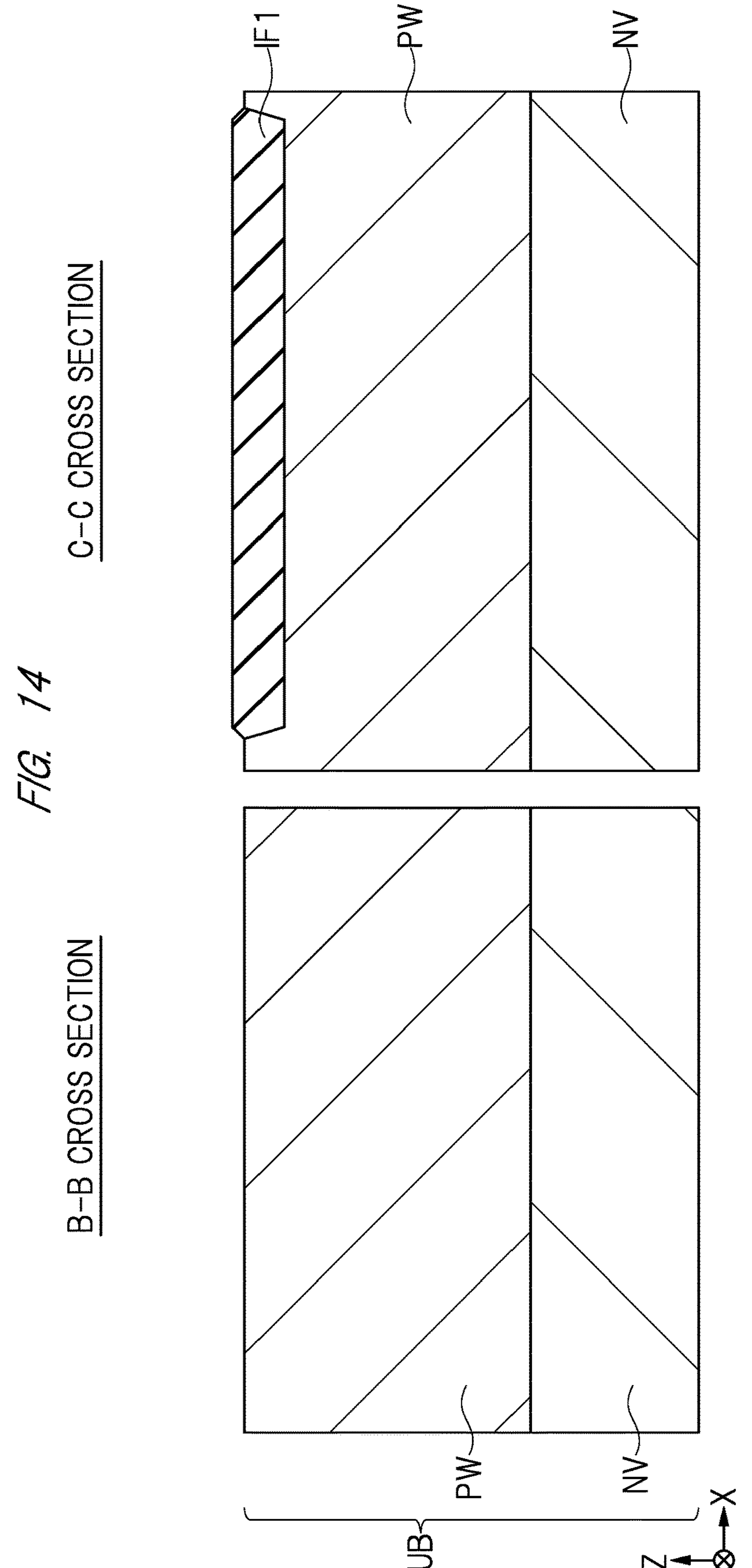
FIG. 14 is a cross-sectional view showing the manufacturing process following FIG. 12.

As shown in FIGS. 13 and 14, an n-type hole barrier region NHB is formed in the semiconductor substrate SUB in the region 1A on the upper surface side of the semiconductor substrate SUB by a photolithographic technique and an ion implantation method. Next, by a photolithographic technique and an ion implantation method, a p-type floating region PF is formed in the semiconductor substrate SUB in the region 1A on the upper surface side of the semiconductor substrate SUB, and a p-type well region PW is formed in the semiconductor substrate SUB in the region 2A. The floating region PF is physically separated from the well region PW.

Figure 15:
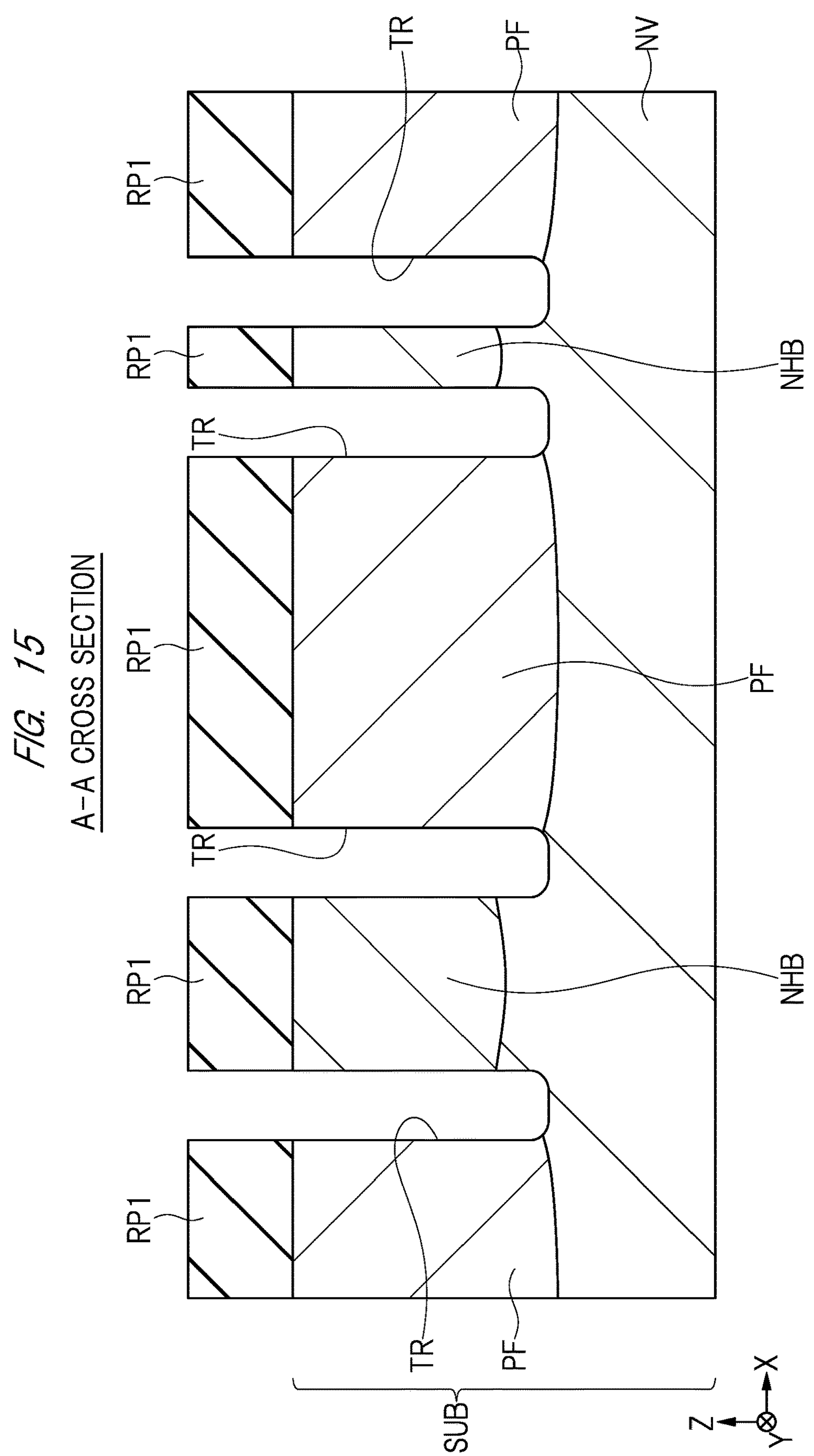
FIG. 15 is a cross-sectional view showing the manufacturing process following FIGS. 13 and 14.

As shown in FIG. 15, on the upper surface side of the semiconductor substrate SUB, a pair of trenches TR are formed in the semiconductor substrate SUB of the active cell AC and the semiconductor substrate SUB of the inactive cell IAC in the region 1A, respectively. First, a resist pattern RP1 is formed on the upper surface of the semiconductor substrate SUB in the region 1A so as to cover a portion of the region 1A and the region 2A. Next, by using the resist pattern RP1 as a mask, an anisotropic etching processing is performed to the semiconductor substrate SUB in the region 1A. Consequently, the plurality of trenches TR are formed in the semiconductor substrate SUB in the region 1A. Thereafter, the resist pattern RP1 is removed by an ashing processing.

Figure 16:
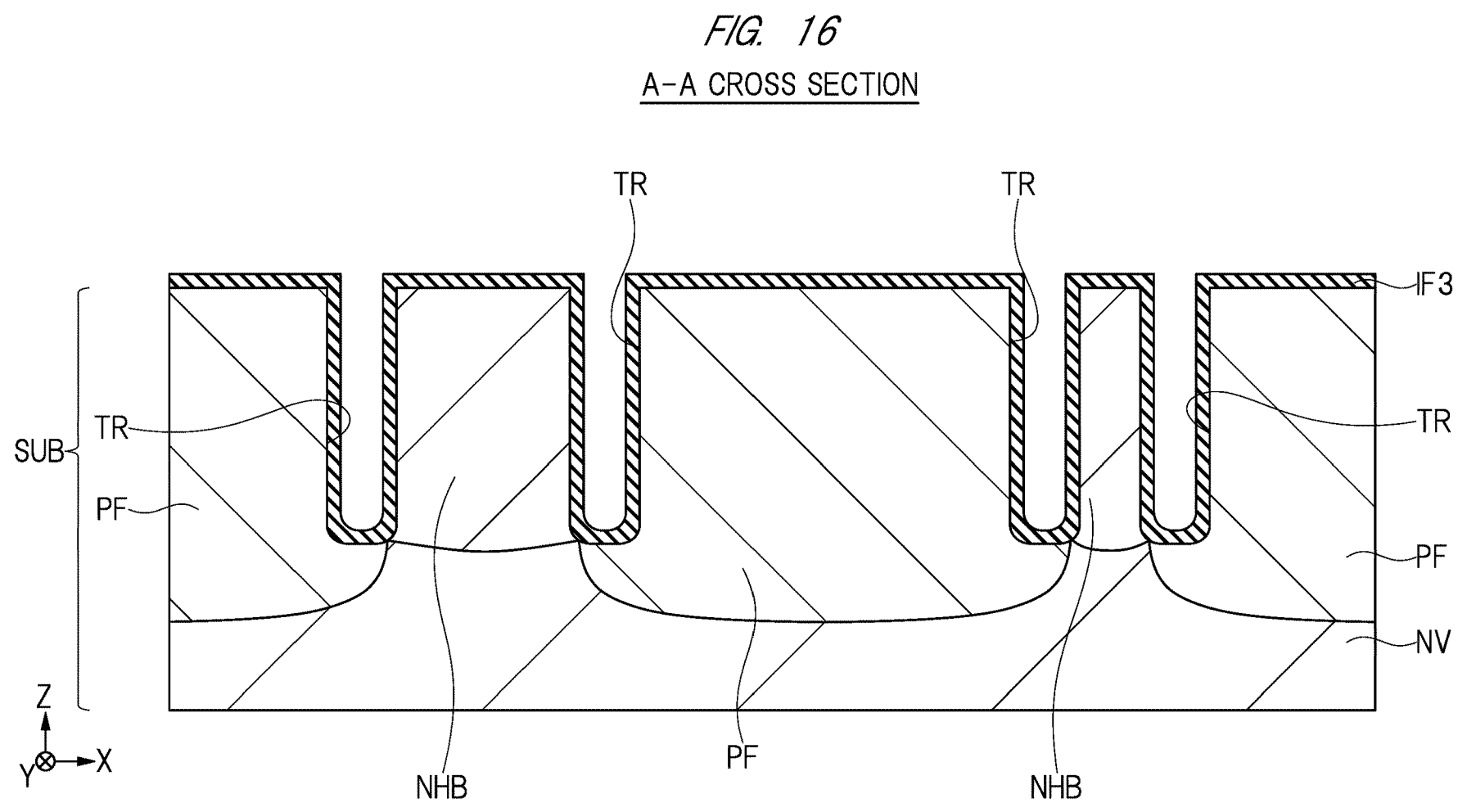
Figure 17:
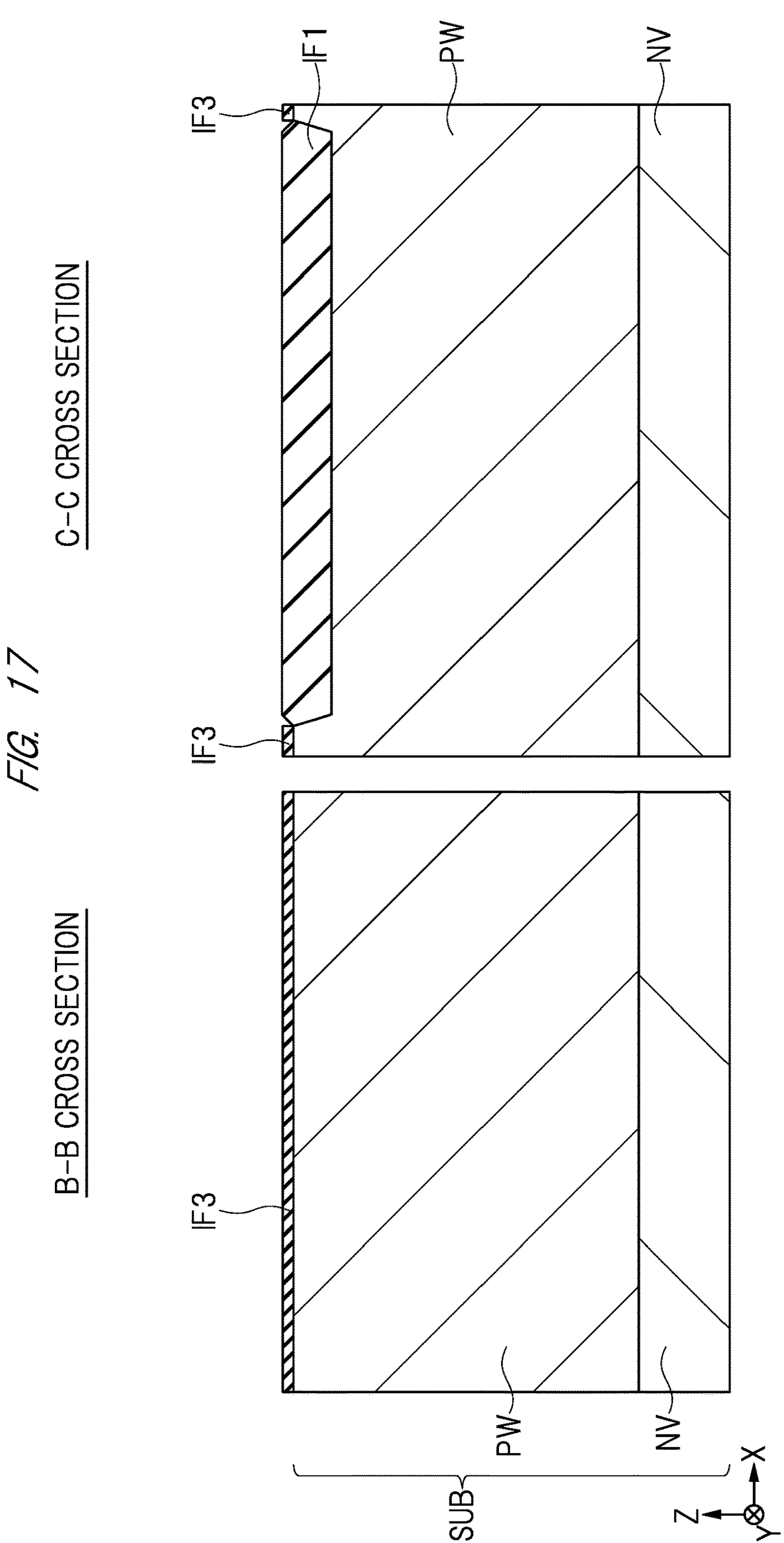
FIG. 17 is a cross-sectional view showing the manufacturing process following FIG. 15.

As shown in FIGS. 16 and 17, a sacrificial oxide film IF3 is formed in the trench TR and on the upper surface of semiconductor substrate SUB. Consequently, a damaged layer formed in the semiconductor substrate SUB is removed. Thereafter, the sacrificial oxide film IF3 is removed by an isotropic etching processing using, for example, a solution containing hydrofluoric acid.

Note that the sacrificial oxide film IF3 is formed by performing a heat treatment to the semiconductor substrate SUB. This heat treatment is performed, for example, in an atmosphere filled with oxygen gas and on the condition that it satisfies a temperature of 1100° C. and a period of time of at least 30 minutes and at most 60 minutes. By this heat treatment, impurities contained in the hole barrier region NHB, floating region PF, and well region PW are diffused.

Figure 18:
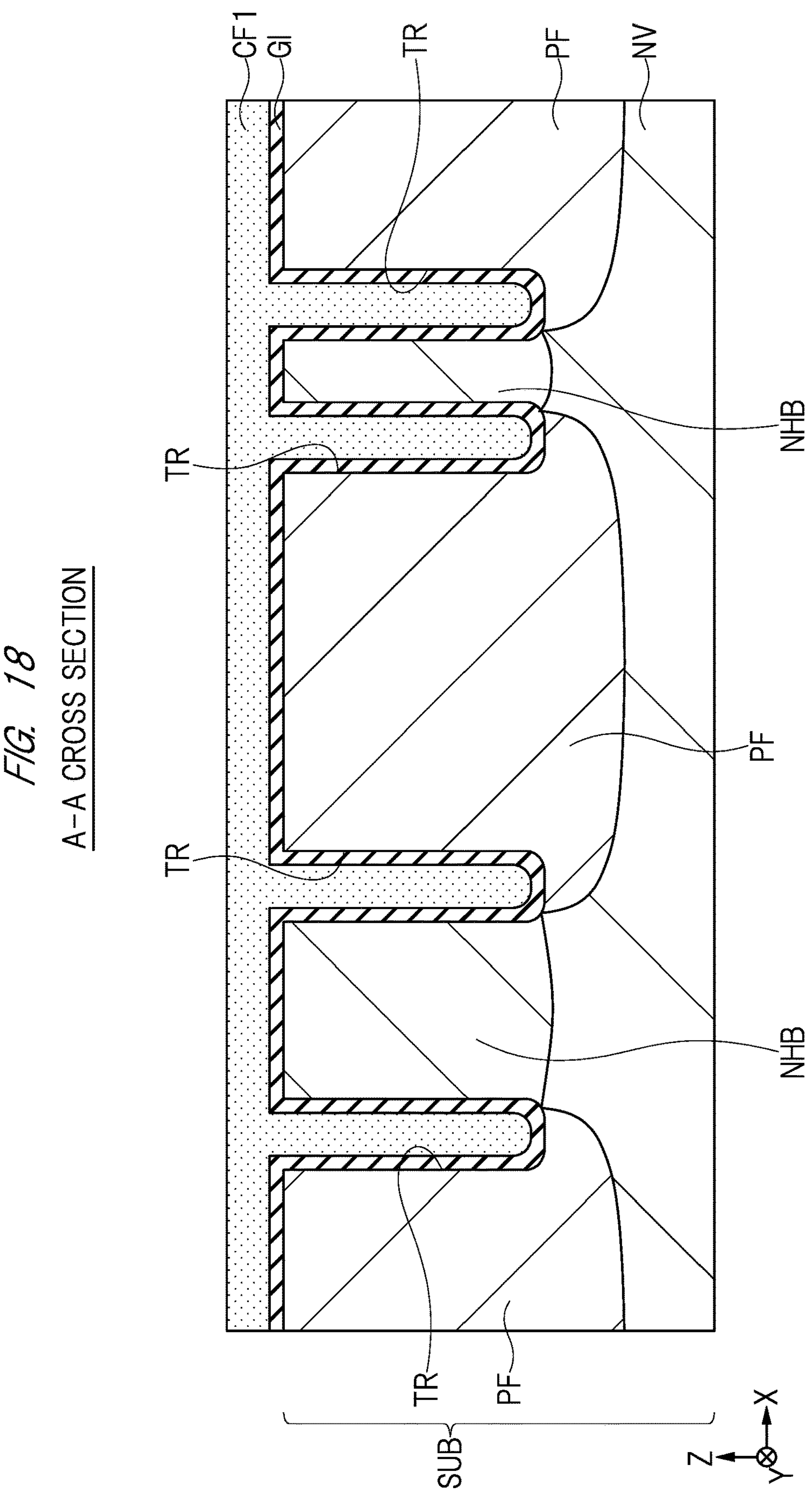
FIG. 18 is a cross-sectional view showing the manufacturing process following FIGS. 16 and 17.

As shown in FIG. 18, a gate insulating film GI and a conductive film CF1 are formed. First, the gate insulating film GI is formed in the trench TR and on the upper surface of the semiconductor substrate SUB by a thermal oxidation method.

Next, the conductive film CF1 is formed in the trench TR and on the upper surface of the semiconductor substrate SUB by, for example, a CVD method so as to embed an inside of the trench TR via the gate insulating film GI. The conductive film CF1 is, for example, a polycrystalline silicon film introducing n-type impurities.

Figure 19:
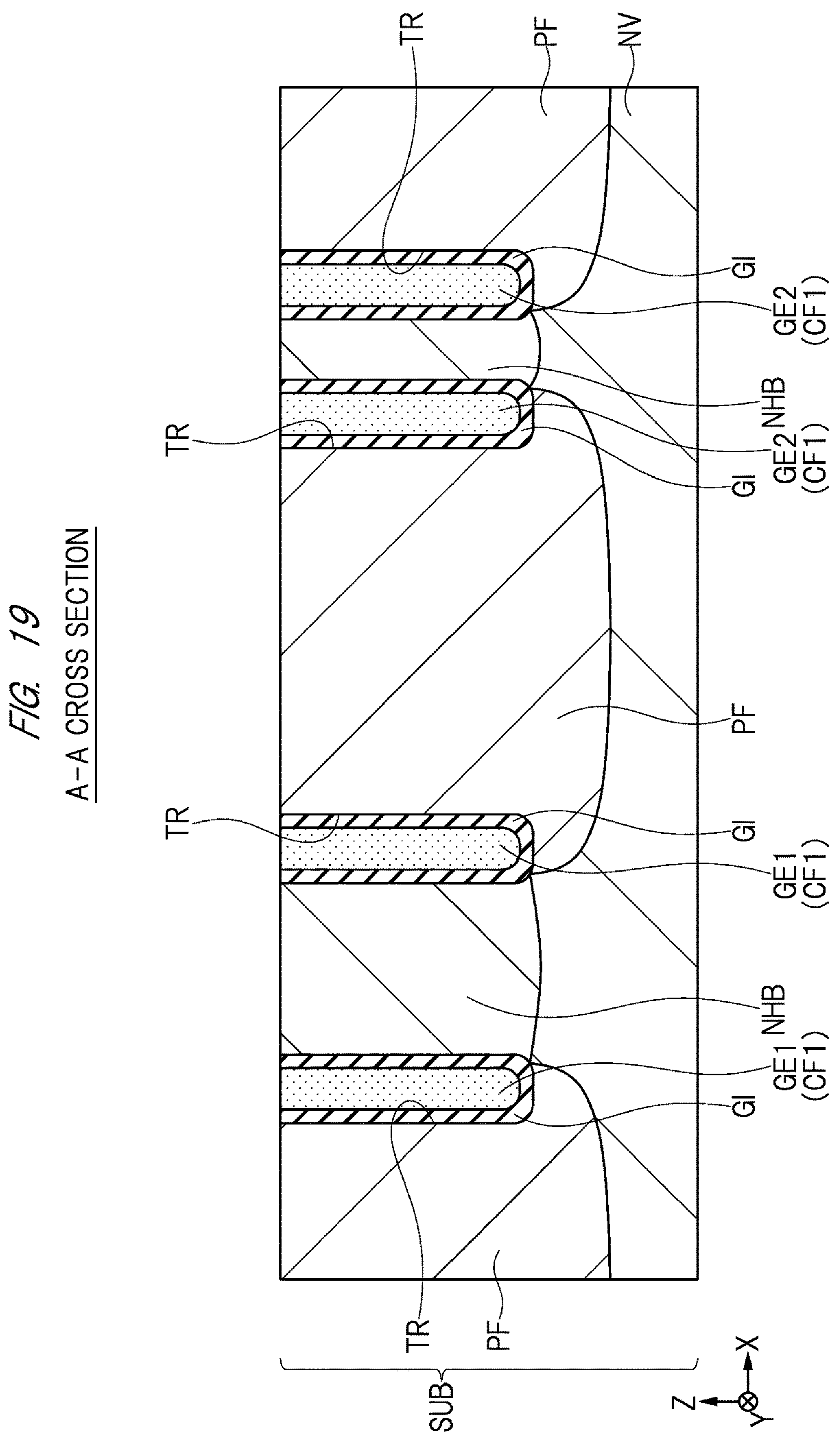
FIG. 19 is a cross-sectional view showing the manufacturing process following FIG. 18.

As shown in FIG. 19, the gate insulating film GI and gate electrodes GE1 and GE2 are formed in the trench TR. First, the conductive film CF1 formed outside the trench TR is removed by an anisotropic etching processing. The conductive film CF1 formed in the trench TR remains as the gate electrodes GE1 and GE2. Next, the gate insulating film GI formed outside the trench TR is removed by an isotropic etching processing, an anisotropic etching processing, or an etching processing combining them.

Figure 20:
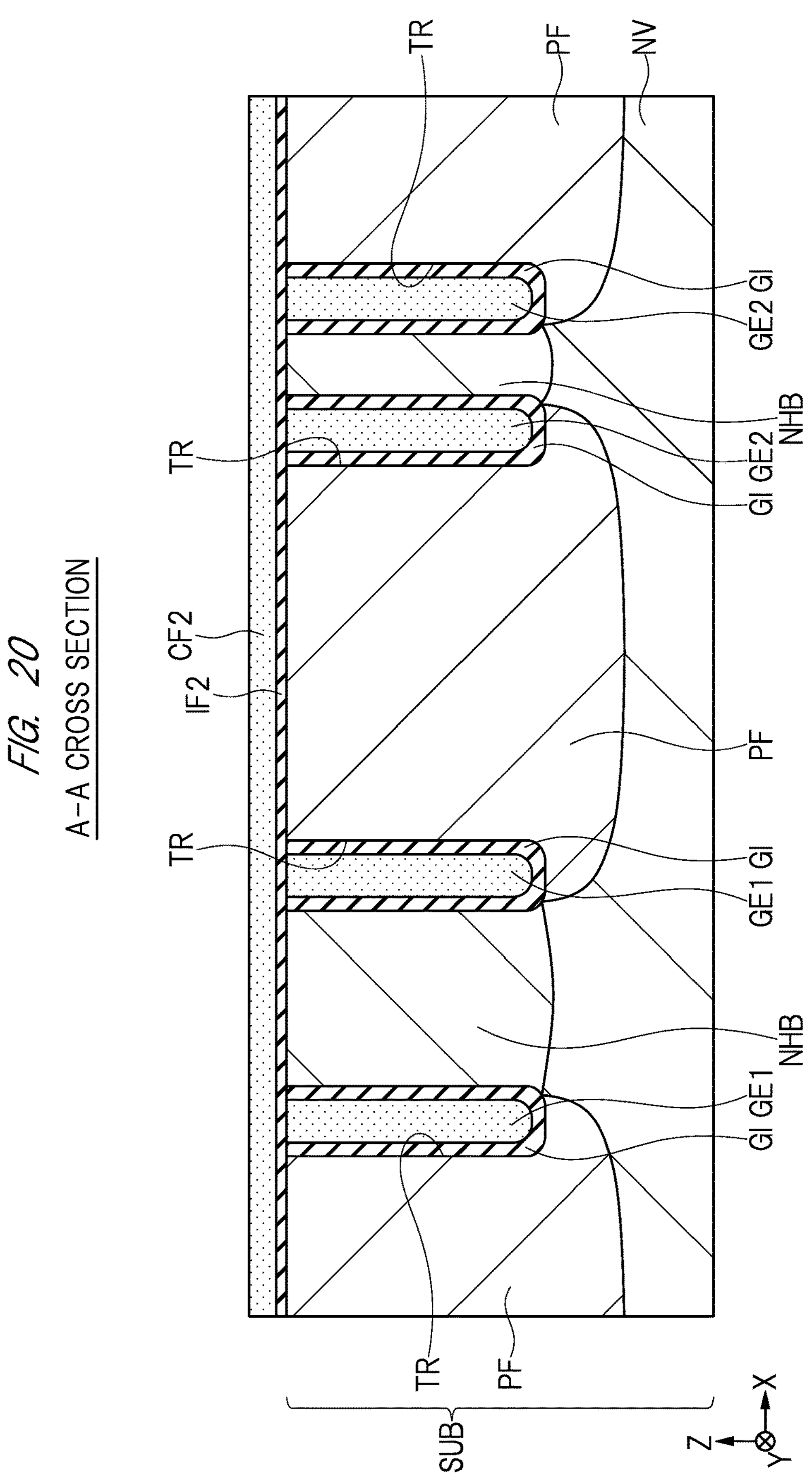
FIG. 20 is a cross-sectional view showing the manufacturing process following FIG. 19.
Figure 21:
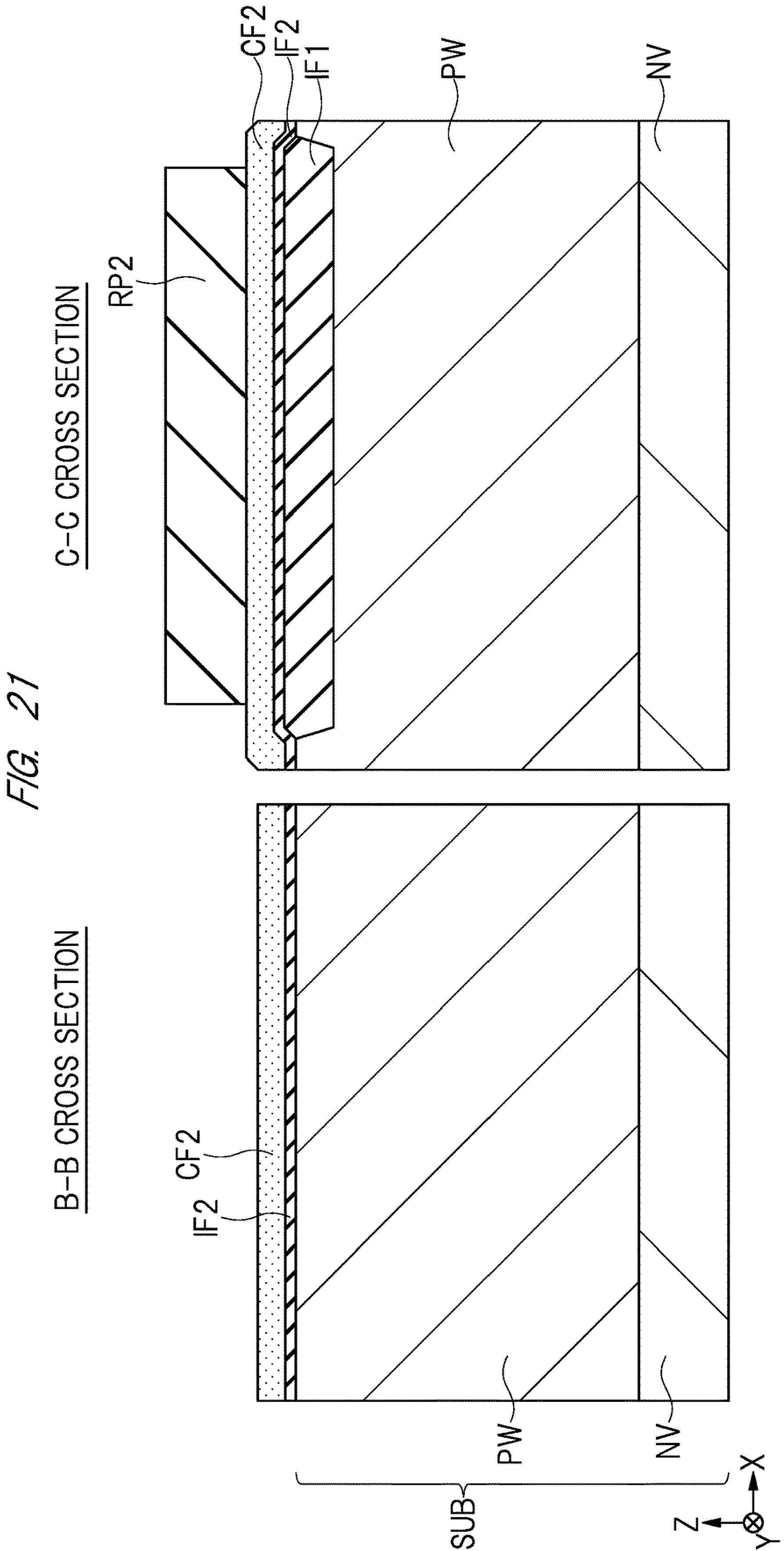
FIG. 21 is a cross-sectional view showing the manufacturing process following FIG. 19.

As shown in FIGS. 20 and 21, an insulating film IF2 is formed on the upper surface of the semiconductor substrate SUB in the region 1A and the region 2A by, for example, a CVD method so as to cover the insulating film IF1. Next, a conductive film CF2 is formed on the insulating film IF2 by, for example, a CVD method. The conductive film CF2 is, for example, a polycrystalline silicon film introducing n-type impurities.

Next, a resist pattern RP2 is formed on the conductive film CF2 in the region 2A so as to selectively cover the conductive film CF2 located on the insulating film IF1.

Figure 22:
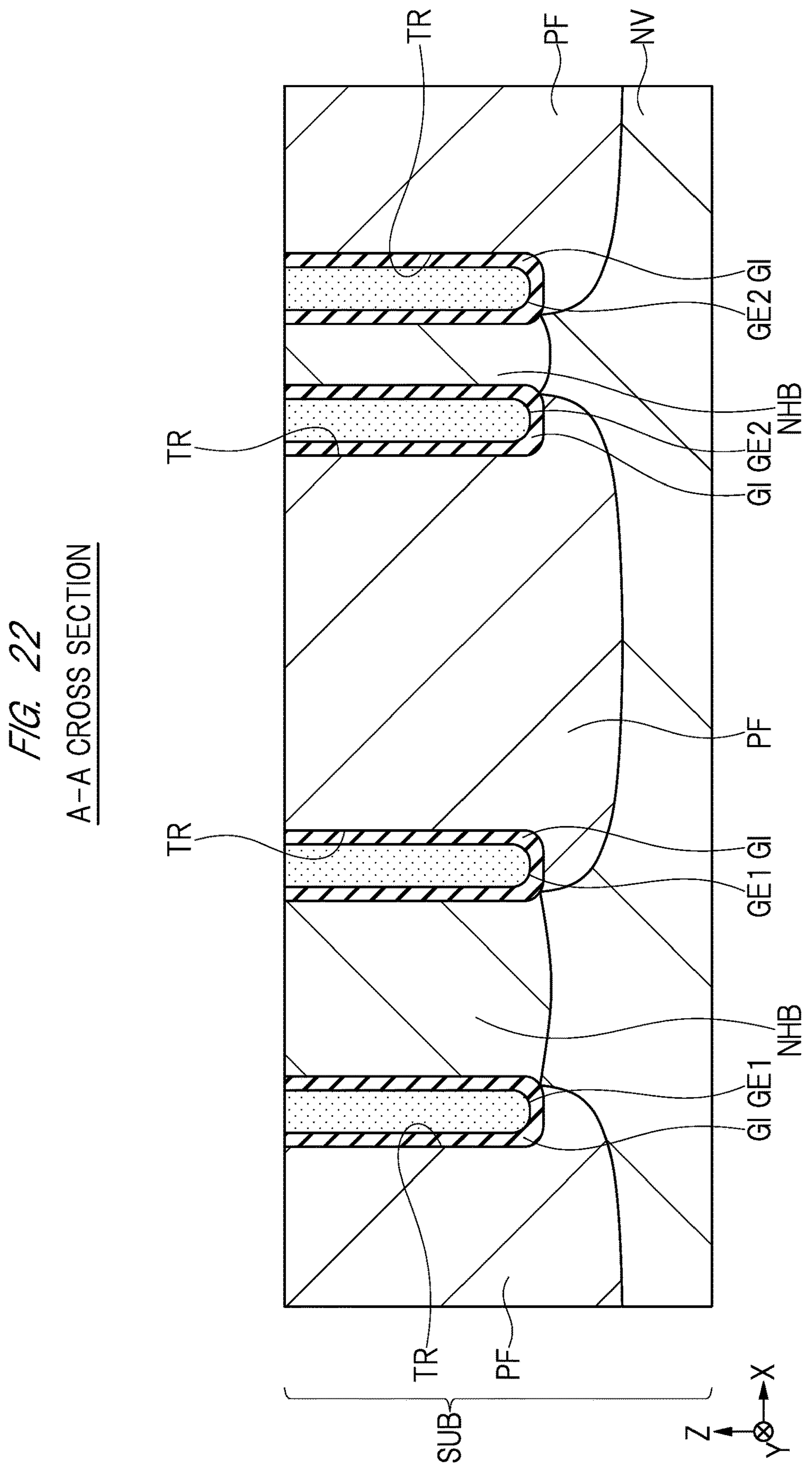
FIG. 22 is a cross-sectional view showing the manufacturing process following FIGS. 20 and 21.
Figure 23:
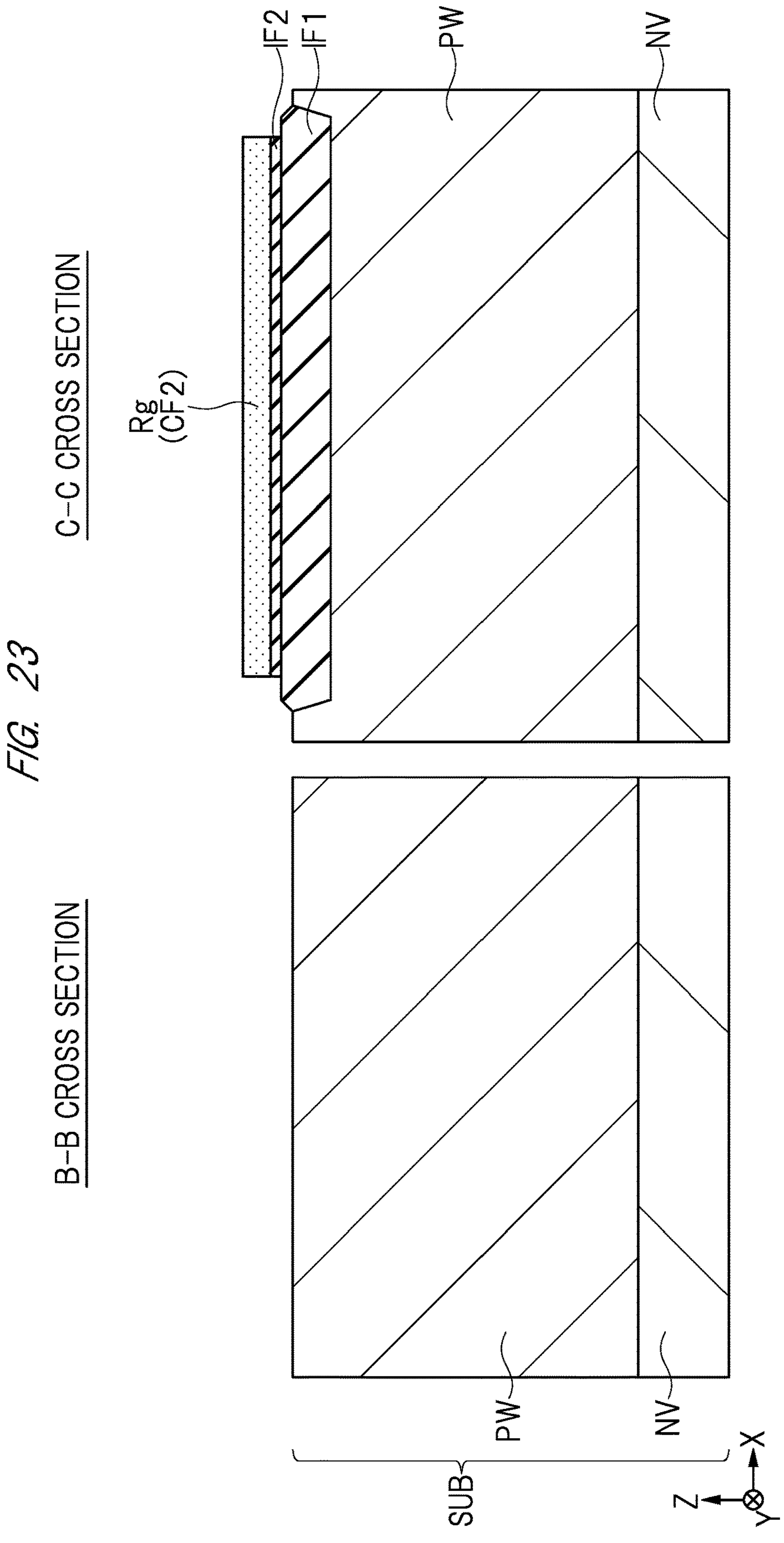
FIG. 23 is a cross-sectional view showing the manufacturing process following FIGS. 20 and 21.

As shown in FIGS. 22 and 23, a dry etching processing is performed by using the resist pattern RP2 as a mask to selectively pattern the conductive film CF2 and the insulating film IF2. Consequently, in the region 1A, the conductive film CF2 and the insulating film IF2 are removed, and in the region 2A, the resistance element Rg, which is a portion of the conductive film CF2, is formed on the insulating film IF1. Thereafter, the resist pattern RP2 is removed by an ashing processing.

Figure 24:
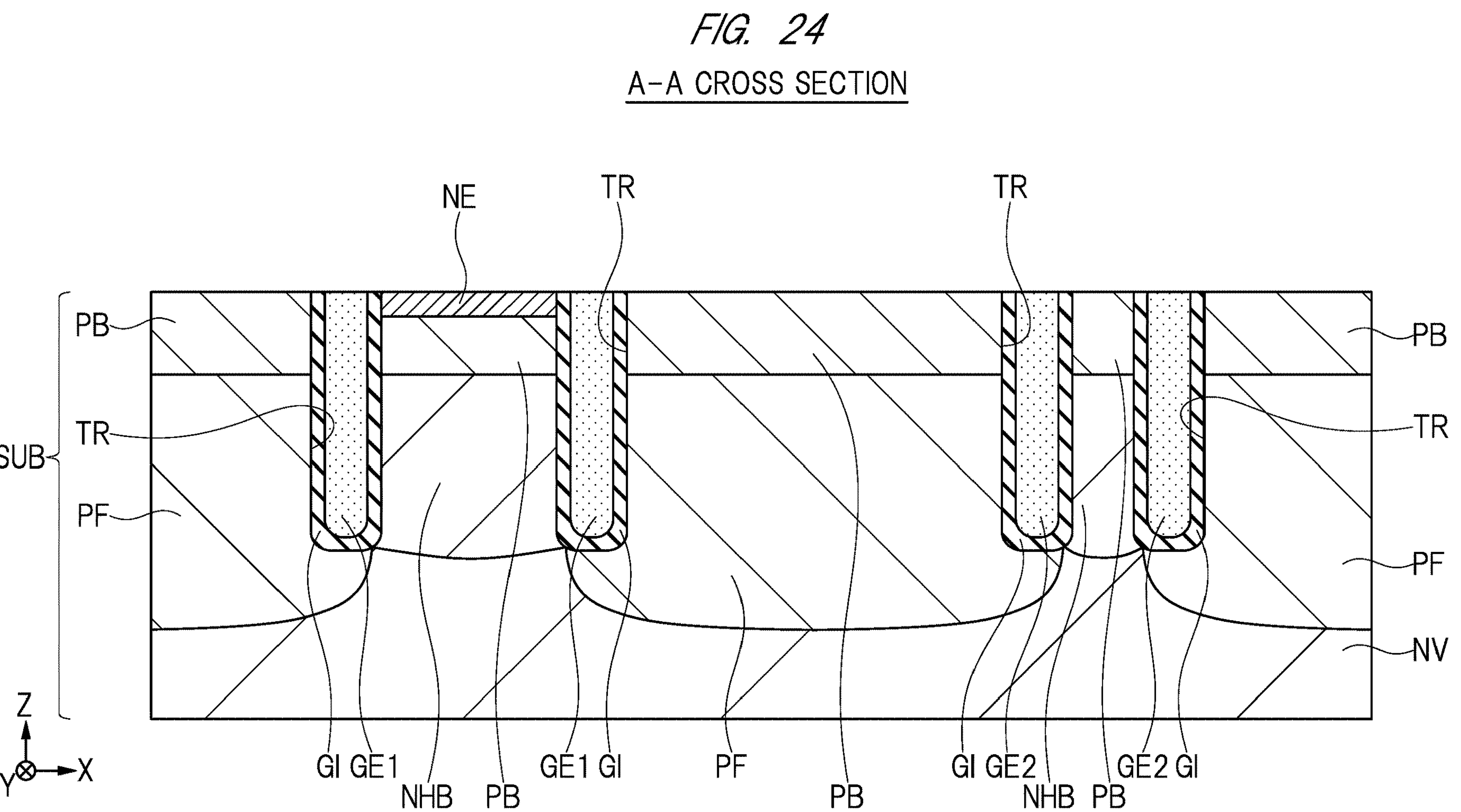
FIG. 24 is a cross-sectional view showing the manufacturing process following FIG. 23.

As shown in FIG. 24, on the upper surface side of the semiconductor substrate SUB, a p-type base region PB is formed in the semiconductor substrate SUB (floating region PF and hole barrier region NHB) in the region 1A by a photolithographic technique and an ion implantation method. Next, an n-type emitter region NE is formed in the base region PB by a photolithographic technique and an ion implantation method. Thereafter, a heat treatment is performed to the semiconductor substrate SUB to activate the impurities contained in each impurity region.

Figure 25:
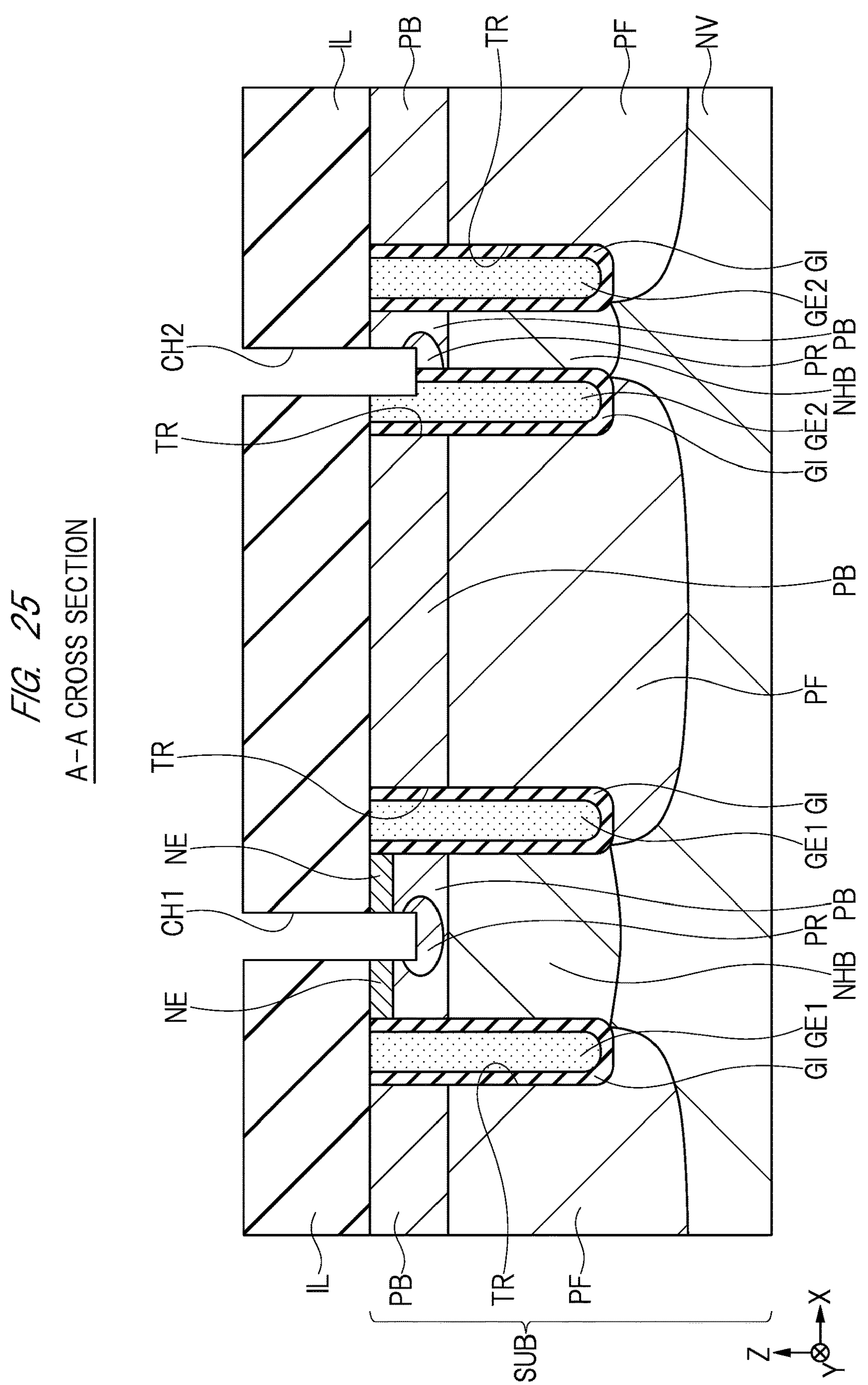
FIG. 25 is a cross-sectional view showing the manufacturing process following FIG. 24.
Figure 26:
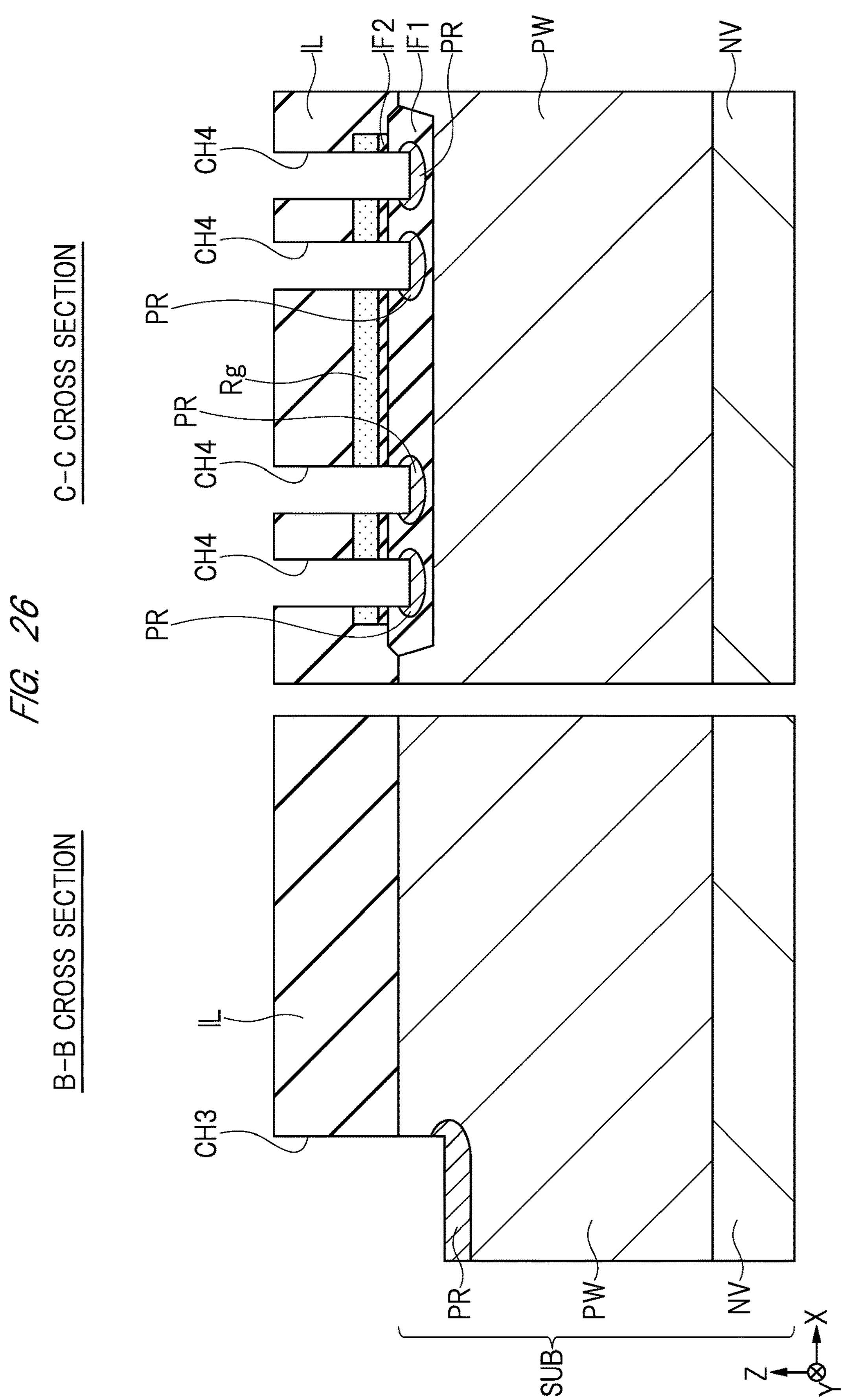
FIG. 26 is a cross-sectional view showing the manufacturing process following FIG. 24.

As shown in FIGS. 25 and 26, an interlayer insulating film IL is formed on the upper surface of the semiconductor substrate SUB in the region 1A and the region 2A by, for example, a CVD method so as to cover the trench TR in the region 1A and to cover the resistance element Rg in the region 2A. Next, in order to flatten an upper surface of the interlayer insulating film IL, the interlayer insulating film IL in the regions 1A and the region 2A is polished by a CMP method.

Next, holes CH1 to CH4 are formed in the interlayer insulating film IL in the region 1A and the region 2A by a photolithographic technique and an anisotropic etching processing. Next, p-type high concentration diffusion regions PR are formed at bottom portions of the holes CH1 to CH4 by an ion implantation method.

The hole CH1 penetrates through the interlayer insulating film IL and the emitter region NE and reaches an inside of the base region PB. The hole CH2 penetrates through the interlayer insulating film IL and reaches the inside of the base region PB. Further, the hole CH2 is formed so as to overlap the gate electrode GE2 in a plan view. The hole CH3 penetrates through the interlayer insulating film IL and reaches an inside of the well region PW. The hole CH4 penetrates through the interlayer insulating film IL and the resistance element Rg and reaches an inside of the insulating film IF1.

Note that although the holes CH1 to CH3 reach the inside of the semiconductor substrate SUB, an etching rate becomes low after the hole CH4 reaches the insulating film IF1, so that the bottom portion of the hole CH4 remains in the insulating film IF1.

Figure 27:
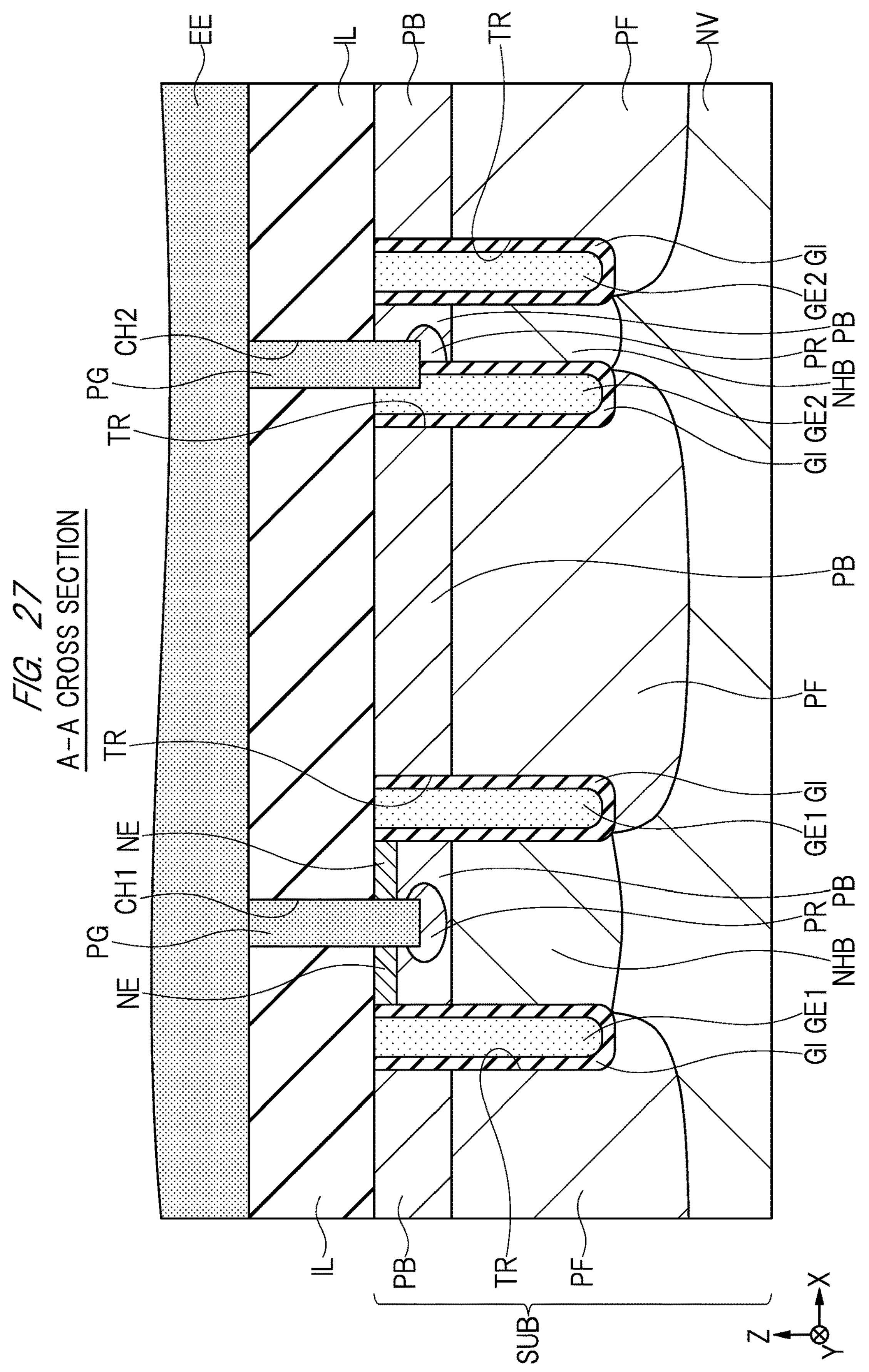
FIG. 27 is a cross-sectional view showing the manufacturing process following FIGS. 25 and 26.
Figure 28:
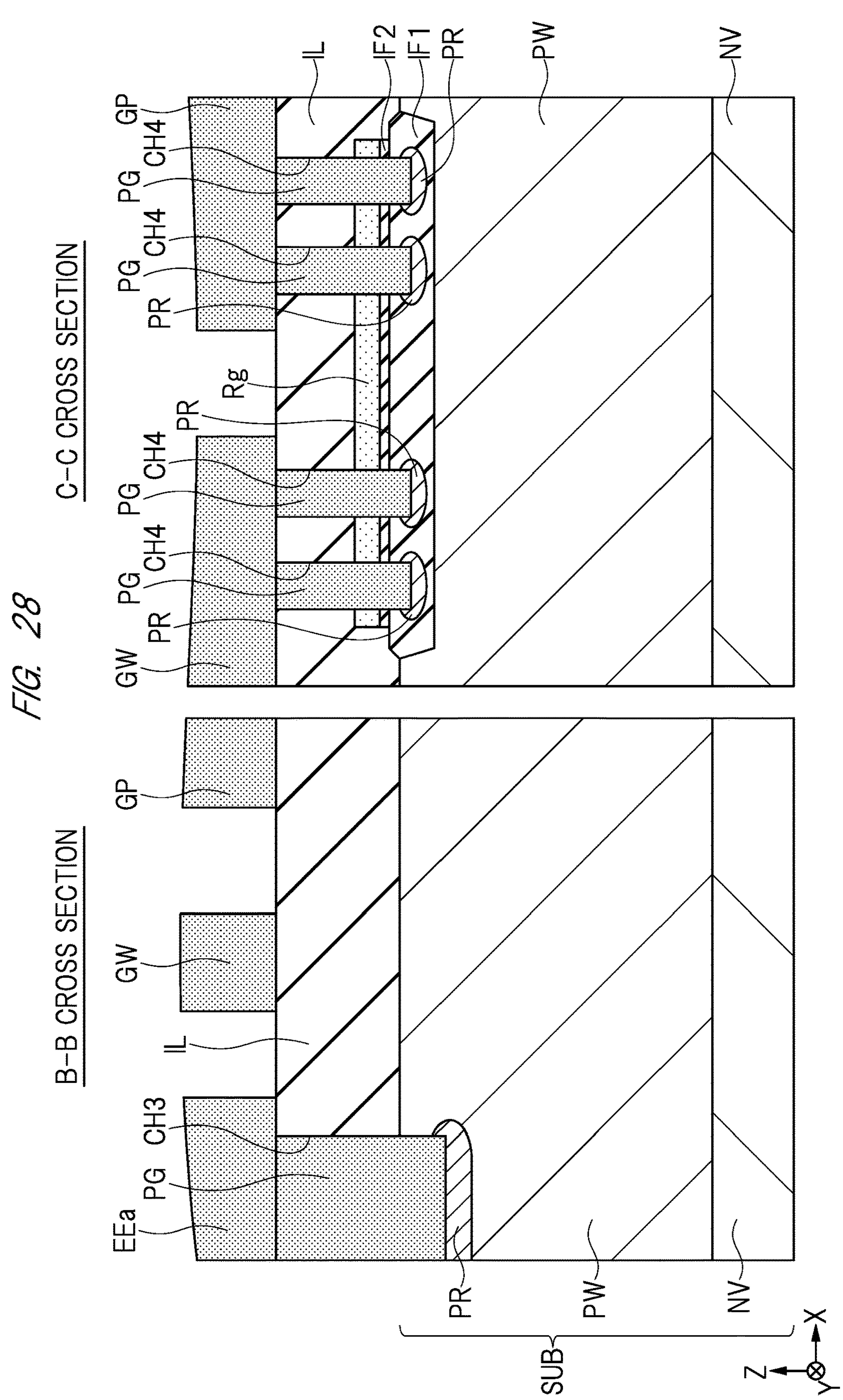
FIG. 28 is a cross-sectional view showing the manufacturing process following FIGS. 25 and 26.

As shown in FIGS. 27 and 28, a plug PG is formed in each of the holes CH1 to CH4. First, a barrier metal film is formed in each of the holes CH1 to CH4 and on the interlayer insulating film IL. For example, the barrier metal film can be formed by forming a titanium film in each of the holes CH1 to CH4 and on the interlayer insulating film IL with a sputtering method and by forming a titanium nitride film on the titanium film with, for example, a sputtering method.

Next, a conductive film made of, for example, a tungsten film is formed on the barrier metal film by, for example, a CVD method so as to embed the inside of each of the holes CH1 to CH4. Next, the conductive film and the barrier metal film formed outside each of the holes CH1 to CH4 are removed by an anisotropic etching processing. Consequently, the plugs PG are formed so as to embed the inside of each of the holes CH1 to CH4.

Next, an emitter electrode EE is formed on the interlayer insulating film IL. First, a TiW film is formed on the interlayer insulating film IL by, for example, a sputtering method, and an aluminum alloy film is formed on the TiW film by, for example, a sputtering method. Next, the TiW film and the aluminum alloy film are patterned by a photolithographic technique and a dry etching processing to form the emitter electrode EE. Note that the gate wiring GW and the gate pad GP are also formed on the interlayer insulating film IL in the same step as a step of forming the emitter electrode EE.

Furthermore, during the patterning, a convex portion EEa of the emitter electrode EE and a concave portion GWa of the gate wiring GW are also formed.

Thereafter, the structures shown in FIGS. 3 and 5 are obtained through the following manufacturing steps. First, by performing an ion implantation from a lower surface side of the semiconductor substrate SUB, an n-type field stop region NS and a p-type collector region PC are formed. After these ion implantations, laser annealing is performed to activate impurities contained in the field stop region NS and the collector region PC. Next, a metal film such as an Au film, a Ni film, a Ti film, or an AlSi film is formed under the lower surface of the semiconductor substrate SUB by, for example, a sputtering method. This metal film becomes the collector electrode CE. The collector electrode CE may be a laminated film in which the metal films described above are appropriately laminated.

Second Embodiment

Figure 29:
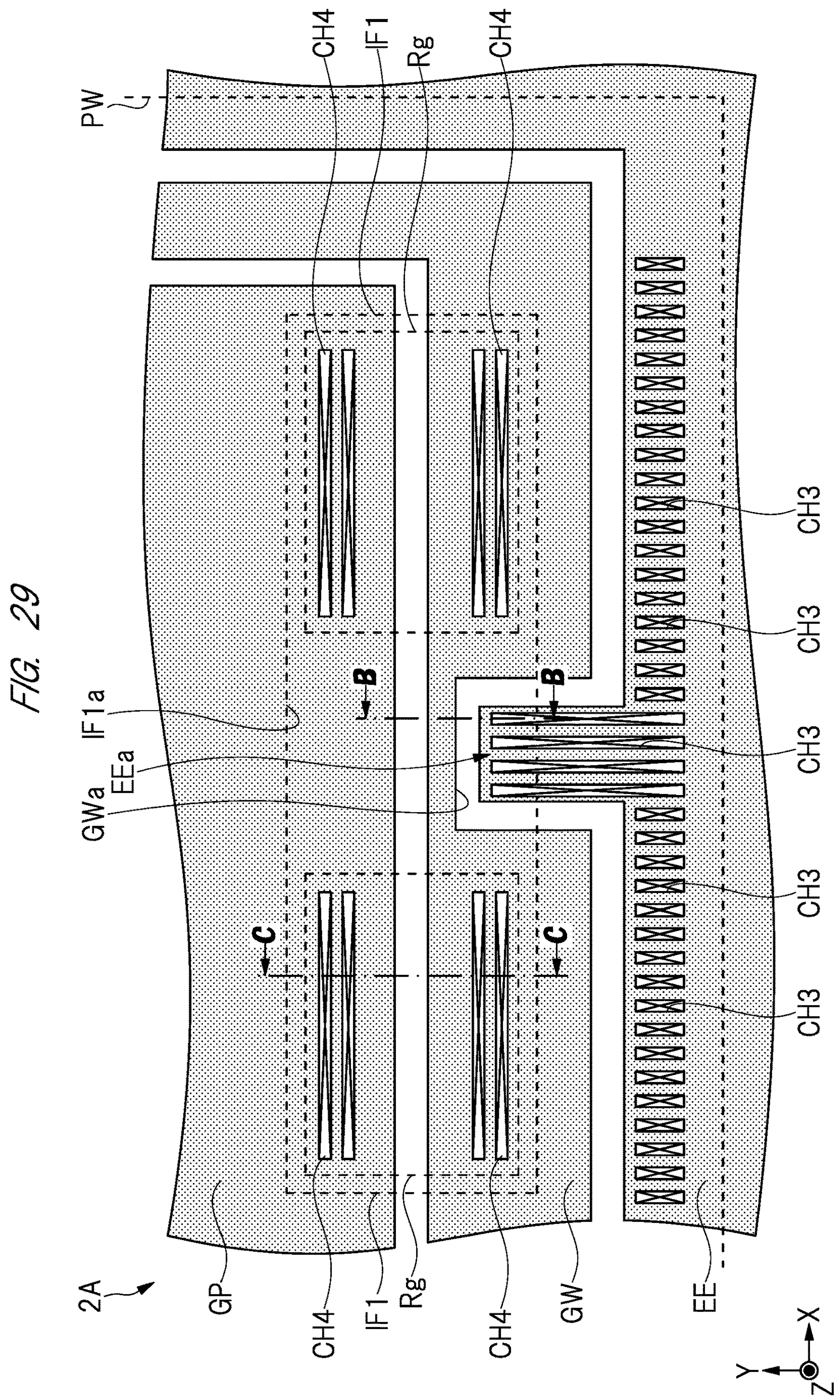
FIG. 29 is a plan view showing a main portion of a semiconductor device according to a second embodiment.

A semiconductor device 100 according to a second embodiment will be described below with reference to FIGS. 29 and 30. Note that in the following description, a difference with the first embodiment will be mainly explained, and a description of points that overlap the first embodiment will be omitted.

In the first embodiment, the insulating film IF1 has been formed on each well region PW located directly under the two resistance elements Rg. In the second embodiment, as shown in FIGS. 29 and 30, a connection portion IF1*a* connecting the two insulating films IF1 is formed on the well region PW. That is, the two insulating films IF1 and the connection portion IF1*a* are an integrated insulating film.

Note that such a connection portion IF1*a* can be formed by changing a pattern shape of the hard mask HM1 in FIGS. 10 and 11.

Figure 30:
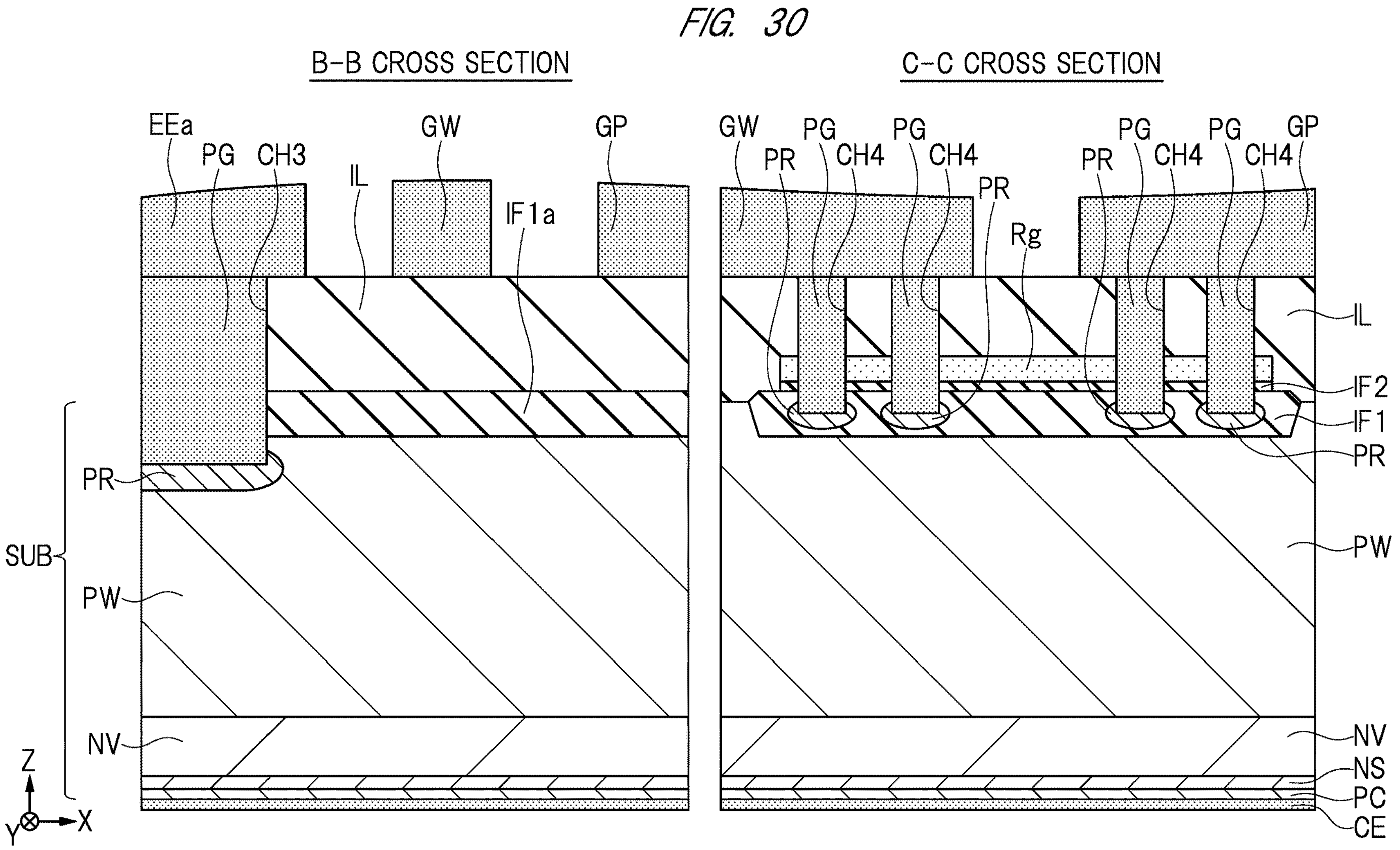
FIG. 30 is a cross-sectional view showing the semiconductor device according to the second embodiment.

Furthermore, as shown in FIG. 30, the connection portion IF1*a* is also formed under the convex portion EEa. The hole CH3 is formed so as to penetrate through the interlayer insulating film IL and the connection portion IF1*a* and reach the well region PW. Therefore, in the second embodiment as well, the convex portion EEa and the well region PW are electrically connected via the hole CH3.

When a width of the convex portion EEa in the X direction is small, a width of each of the two resistance elements Rg in the X direction is increased, but a width of each of the two insulating films IF1 in the X direction is also increased in accordance with the increased width. Therefore, it is necessary to change some layout rules, such as the pattern shape of the hard mask HM1, and the design may become complicated. Like the second embodiment, regardless of the width of the resistance element Rg, the two insulating films IF1 and the connection portion IF1*a* are integrated as one insulating film, and the insulating film IF1 is set as one pattern, which can eliminate the complexity of the design.

Fifth Embodiment

Figure 31:
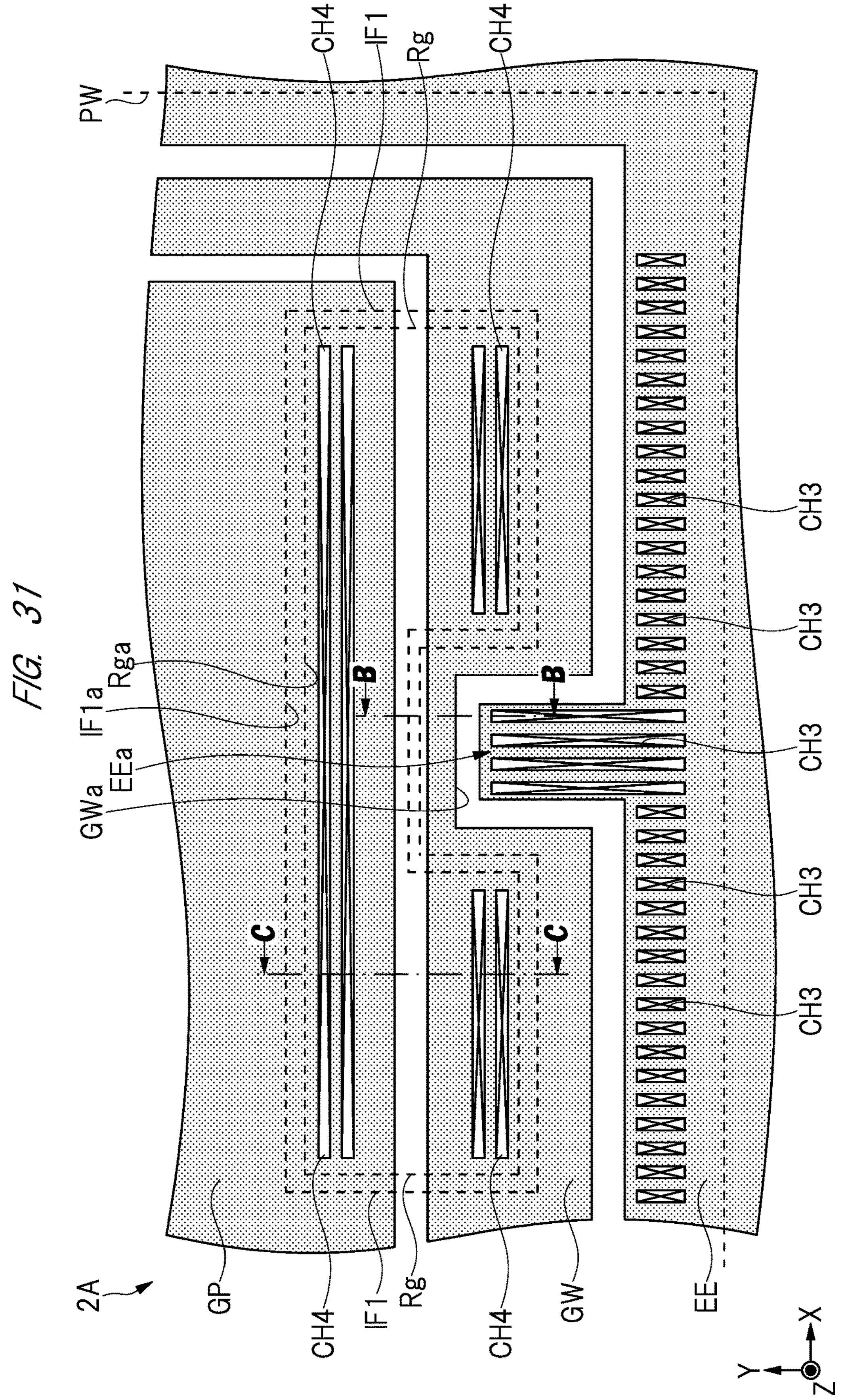
FIG. 31 is a plan view showing a main portion of a semiconductor device according to a third embodiment.
Figure 32:
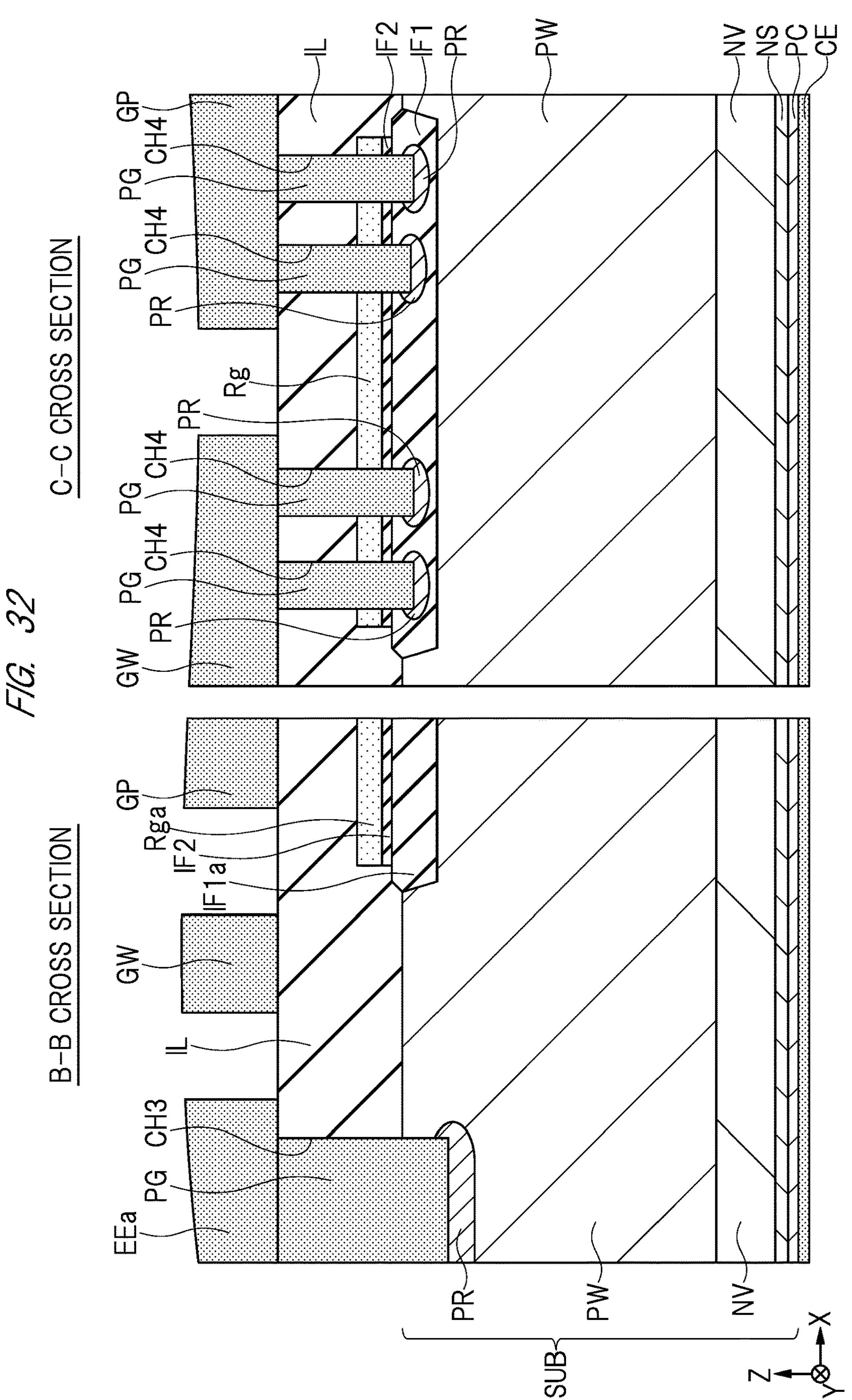
FIG. 32 is a cross-sectional view showing the semiconductor device according to the third embodiment.

A semiconductor device 100 according to a third embodiment will be described below with reference to FIGS. 31 and 32. Note that, in the following description, a difference with the first embodiment and the second embodiment will be mainly explained, and a description of points that overlap the first embodiment and the second embodiment will be omitted.

In a third embodiment, similarly to the second embodiment, a connection portion IF1*a* connecting the two insulating films IF1 is formed, but the connection portion IF1*a* is not formed under the convex portion EEa but is located under the gate pad GP.

In the third embodiment, a connection portion Rga connecting the two resistance elements Rg is formed on the connection portion IF1*a*. The connection portion Rga, similarly to the connection portion IF1*a*, is located under the gate pad GP and opposes the convex portion EEa in the Y direction. The two resistance elements Rg and the connection portion Rga are made of an integrated conductive film CF2. Further, the hole CH4 is also formed in the connection portion Rga.

The connection portion IF1*a* in the third embodiment can be formed by changing the pattern shape of the hard mask HM1 in FIGS. 10 and 11. Further, the connection portion Rga in the third embodiment can be formed by changing a pattern shape of the resist pattern RP2 in FIG. 21.

According to the change in the width of the convex portion EEa in the X direction, the width of each of the two resistance elements Rg in the X direction is also changed, but the resistance element Rg and the insulating film IF1 under the gate pad GP are each set as one pattern, so that the complexity of the design under the gate pad GP can be eliminated to some extent.

Fourth Embodiment

Figure 33:
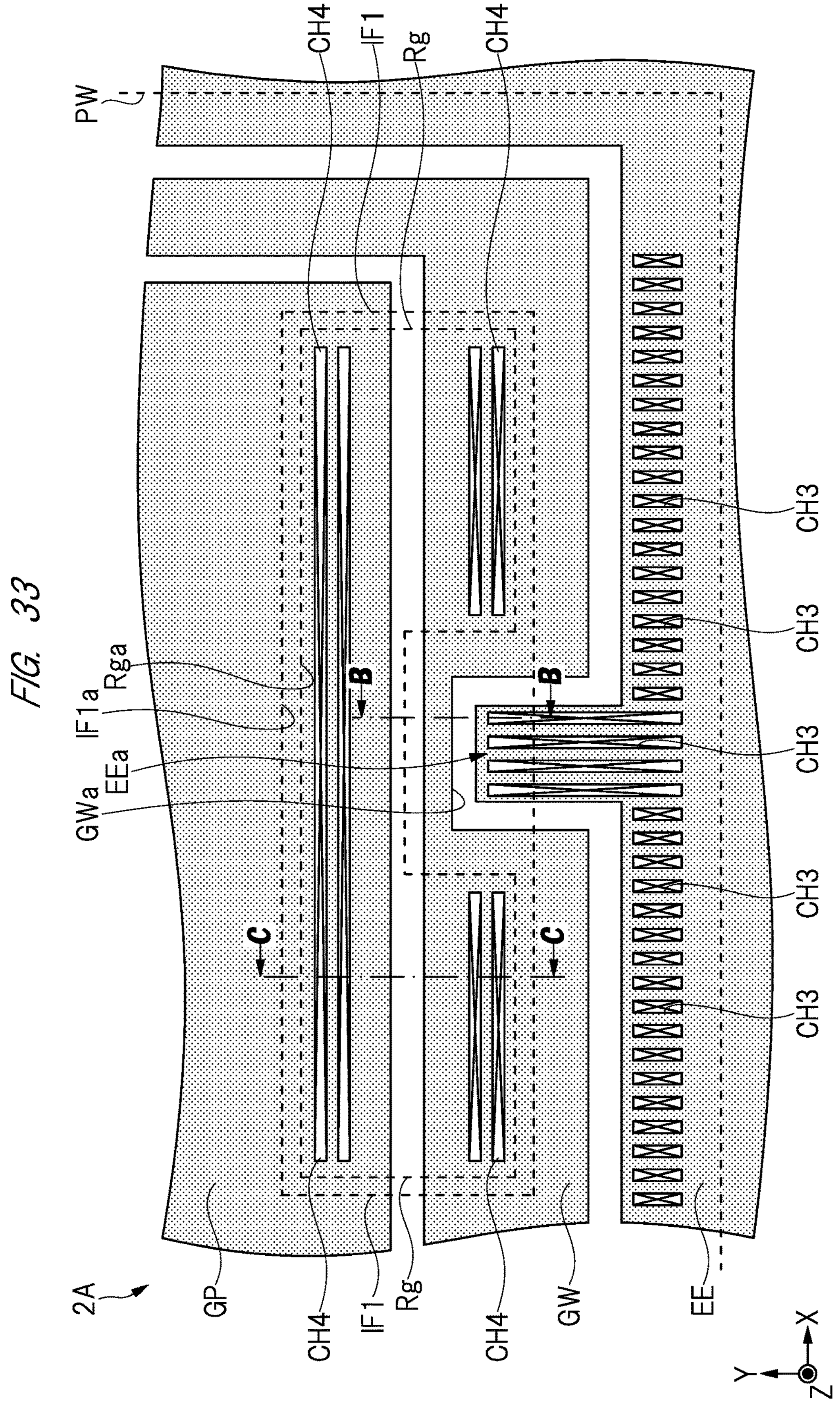
FIG. 33 is a plan view showing a main portion of a semiconductor device according to a fourth embodiment.
Figure 34:
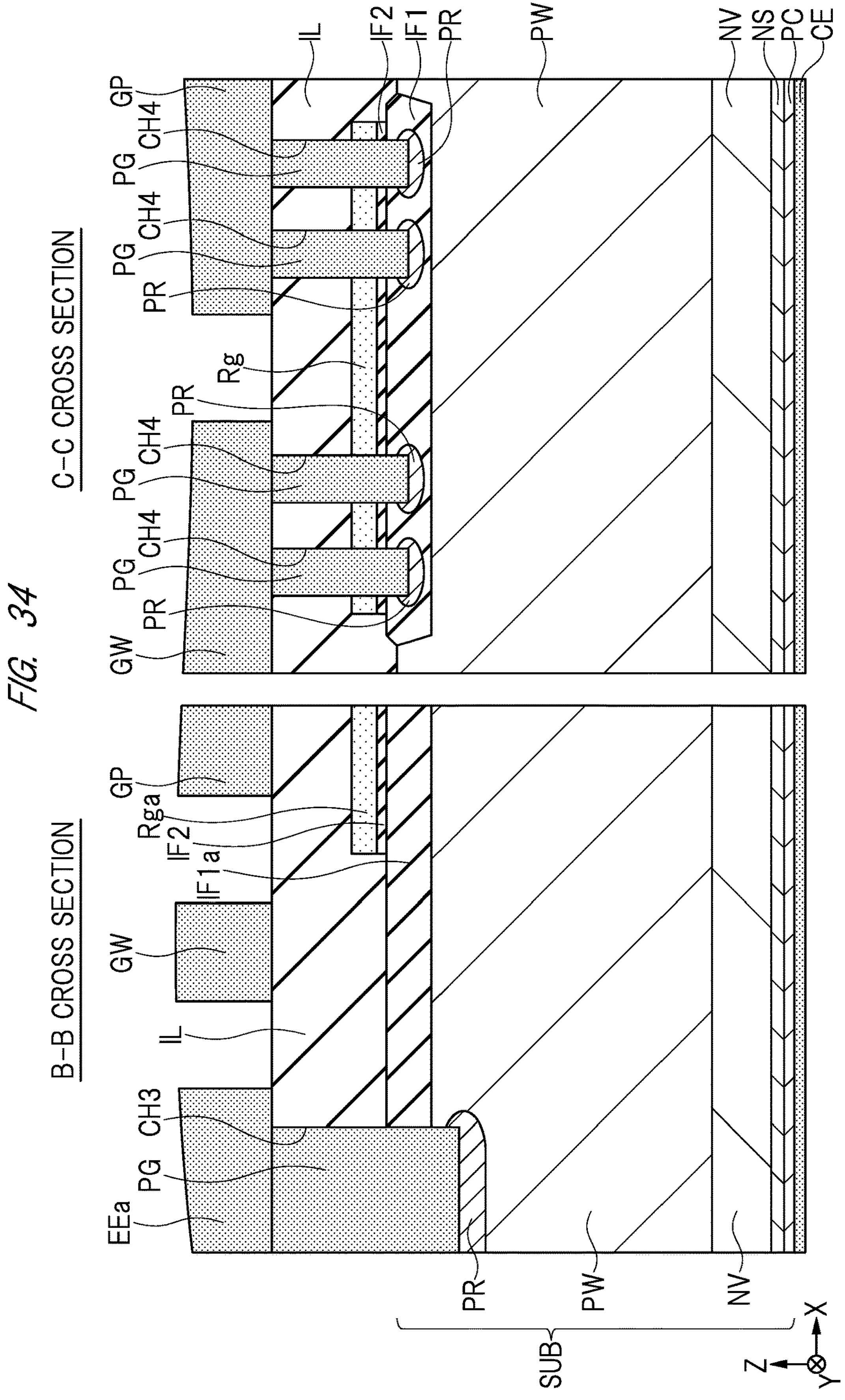
FIG. 34 is a cross-sectional view showing the semiconductor device according to the fourth embodiment.

A semiconductor device 100 according to a fourth embodiment will be described below with reference to FIGS. 33 and 34. Note that in the following description, differences with the first to third embodiments will be mainly explained, and a description of points that overlap the first to third embodiments will be omitted.

In a fourth embodiment, similarly to the third embodiment, a connection portion Rga connecting the two resistance elements Rg is formed, but a planar shape of the connection portion IF1*a* connecting the two insulating films IF1 is the same as that of the second embodiment.

In the fourth embodiment, in comparison with the third embodiment, a pattern shape of the insulating film IF1 is constant, which makes it easier to eliminate the complexity of the design.

Fifth Embodiment

Figure 35:
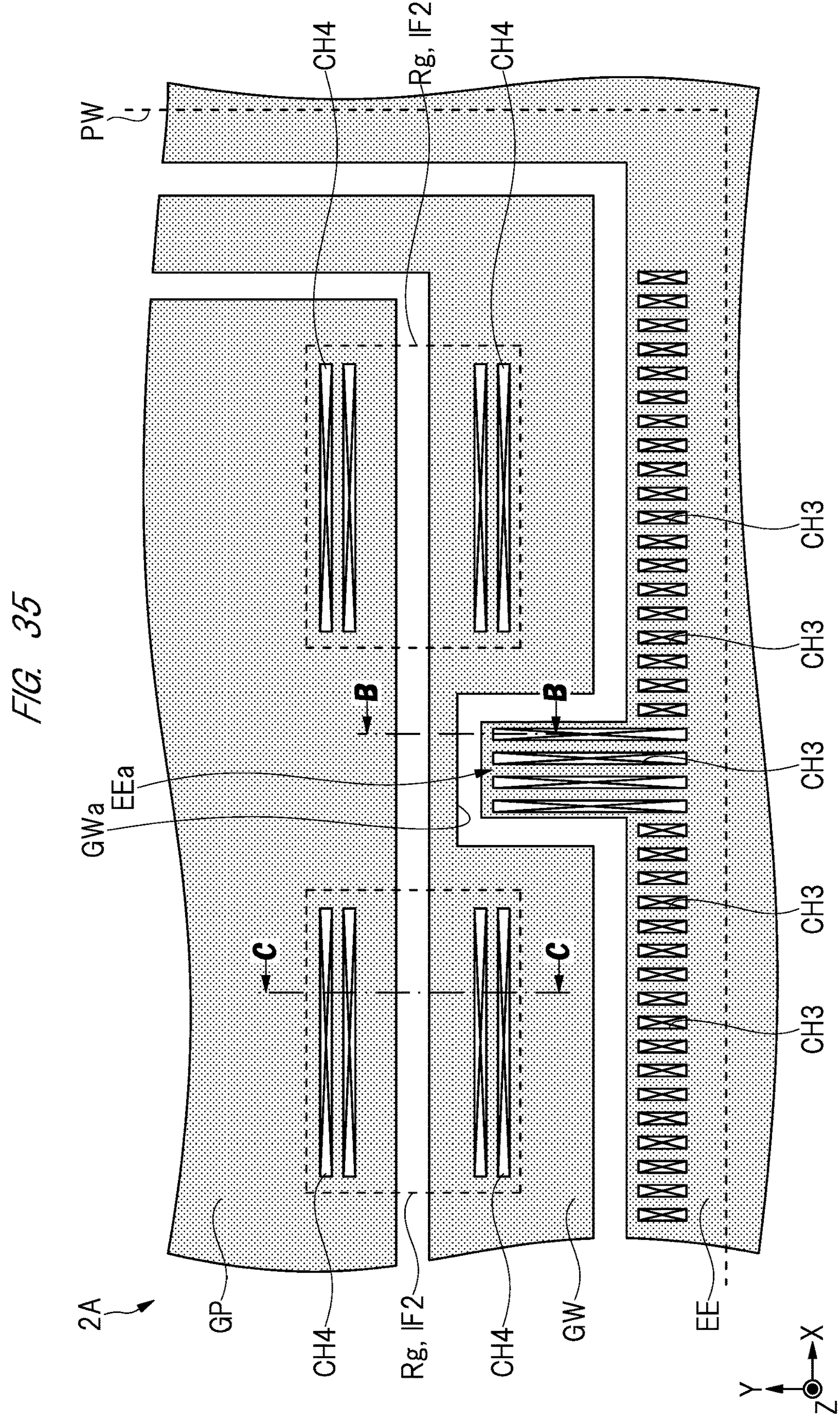
FIG. 35 is a plan view showing a main portion of a semiconductor device according to a fifth embodiment.
Figure 36:
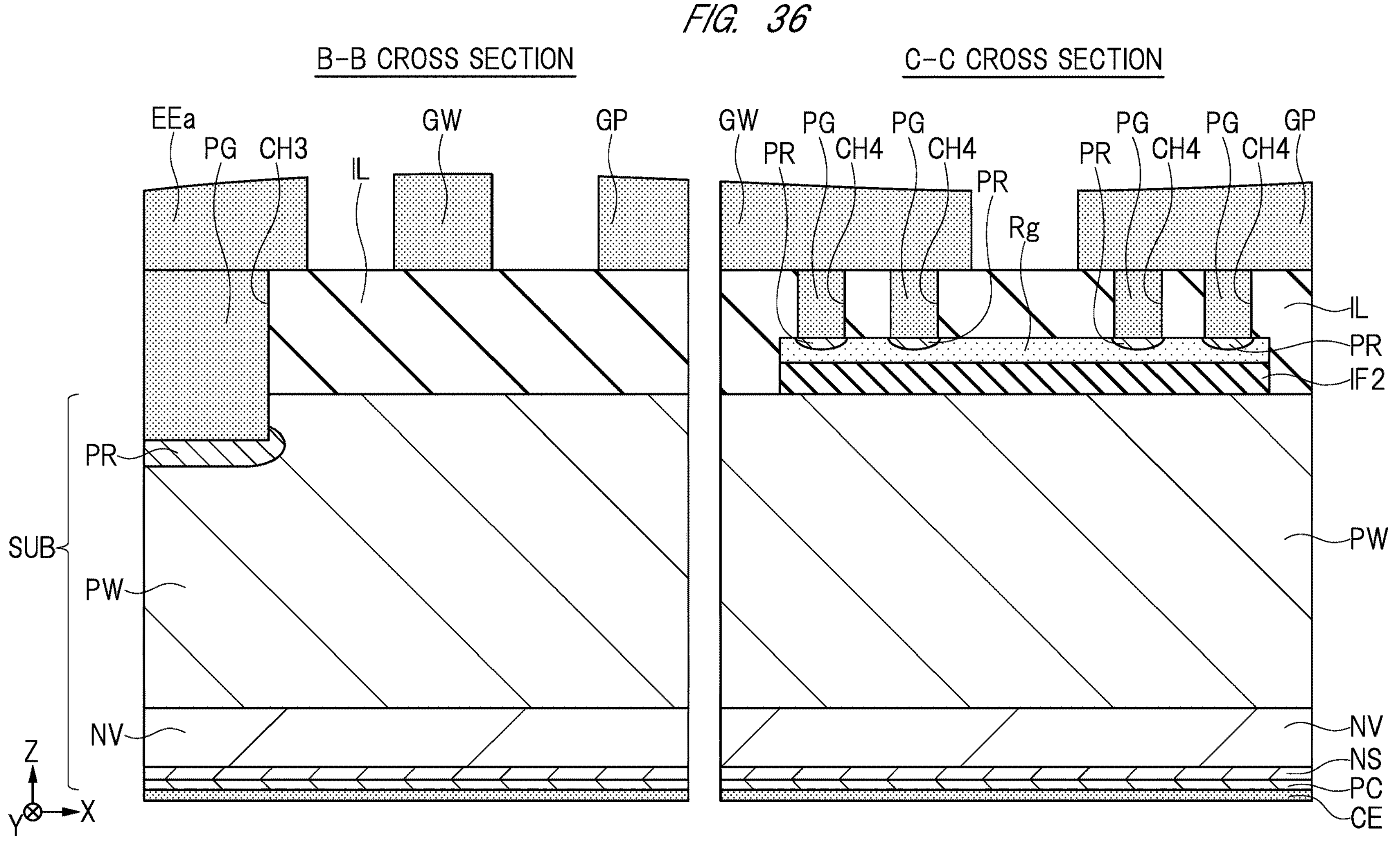
FIG. 36 is a cross-sectional view showing the semiconductor device according to the fifth embodiment.

A semiconductor device 100 according to a fifth embodiment will be described below with reference to FIGS. 35 and 36. Note that in the following description, a difference with the first embodiment will be mainly explained, and a description of points that overlap the first embodiment will be omitted.

In the first embodiment, the insulating film IF1 has been formed under the resistance element Rg. In a fifth embodiment, as shown in FIGS. 35 and 36, the insulating film IF1 is not formed between the resistance element Rg and the well region PW, but only the insulating film IF2 is formed.

In the fifth embodiment, in order to ensure a dielectric withstand voltage between the resistance element Rg and the well region PW, a thickness of the insulating film IF2 is thicker than that of the first embodiment, for example, 300 nm or more and 600 nm or less.

The resistance element Rg in the fifth embodiment and the insulating film under the resistance element Rg can be formed by a series of steps shown in FIGS. 20 to 23 as follows. First, in the steps of FIGS. 10 and 11, an opening pattern of the hard mask HM1 is not formed in the region 2A, and in the step of FIG. 12, the insulating film IF1 is not formed in the region 2A. Then, in the steps of FIGS. 20 and 21, an insulating film IF2 and a conductive film CF2 are formed, and in the steps of FIGS. 22 and 23, anisotropic etching is performed by using the resist pattern RP2 as a mask, thereby forming the patterned insulating film IF2 and resistance element Rg.

Note that the bottom portion of the hole CH4 is set so as to remain over the resistance element Rg.

Furthermore, since the insulating film IF2 and the resistance element Rg are patterned in the same step, a side surface of the insulating film IF2 and a side surface of the resistance element Rg are made flush with each other.

In this way, in the fifth embodiment, the dielectric withstand voltage between the resistance element Rg and the well region PW can be ensured without forming the insulating film IF1.

Sixth Embodiment

A semiconductor device 100 according to a sixth embodiment will be described below with reference to FIGS. 37 and 38. Note that in the following description, a difference with the first embodiment will be mainly explained, and a description of points that overlap the first embodiment will be omitted.

In the first embodiment, the concave portion GWa is provided in a portion of the gate wiring GW extending in the X direction. Therefore, the portion of the gate wiring GW is thin, so that when a size of the semiconductor device 100 becomes large, a transient current flowing through the gate wiring GW during a switching operation also increases. If this happens, electromigration life may deteriorate.

Figure 37:
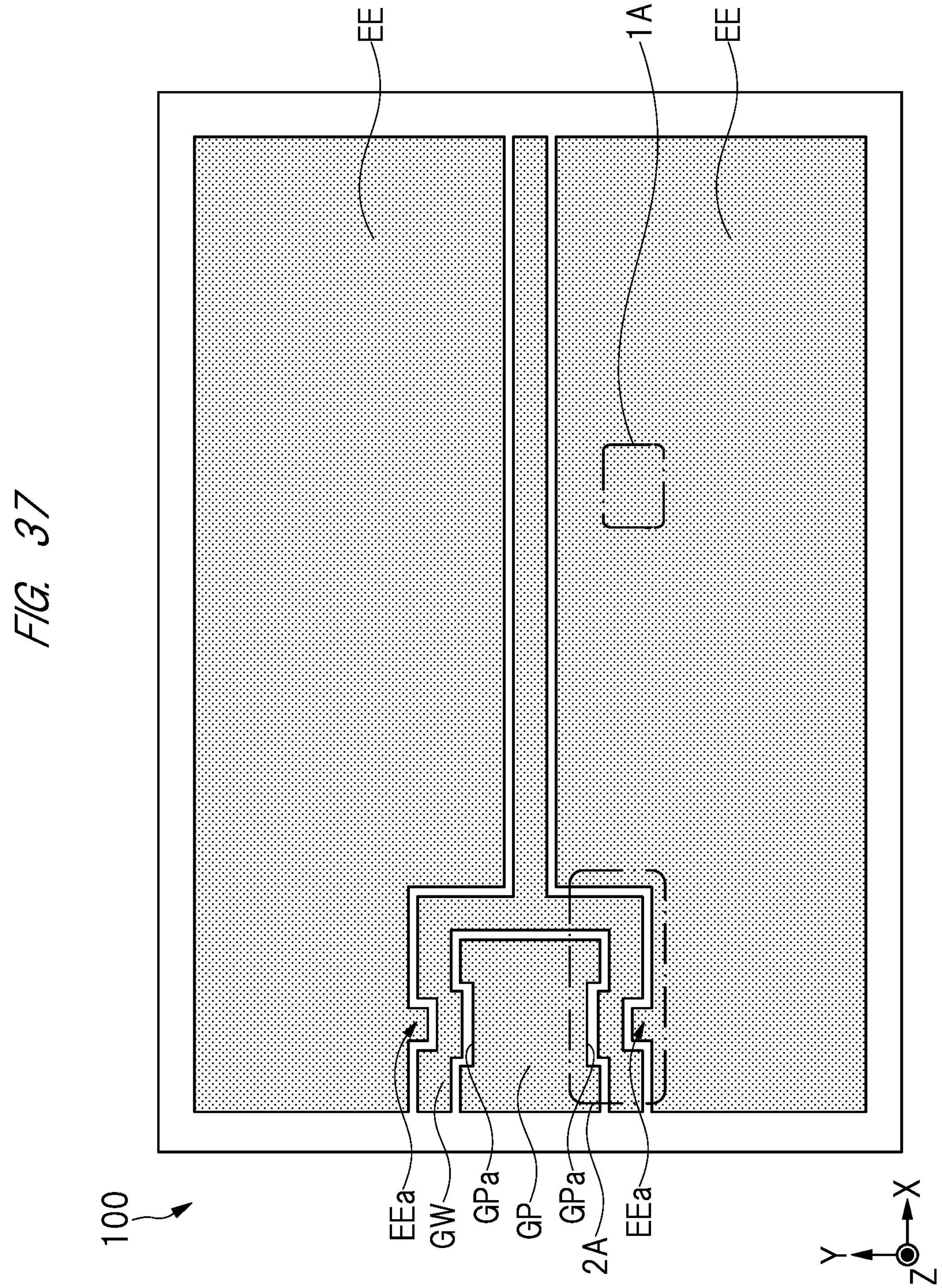
FIG. 37 is a plan view showing the entirety of a semiconductor device according to a sixth embodiment.
Figure 38:
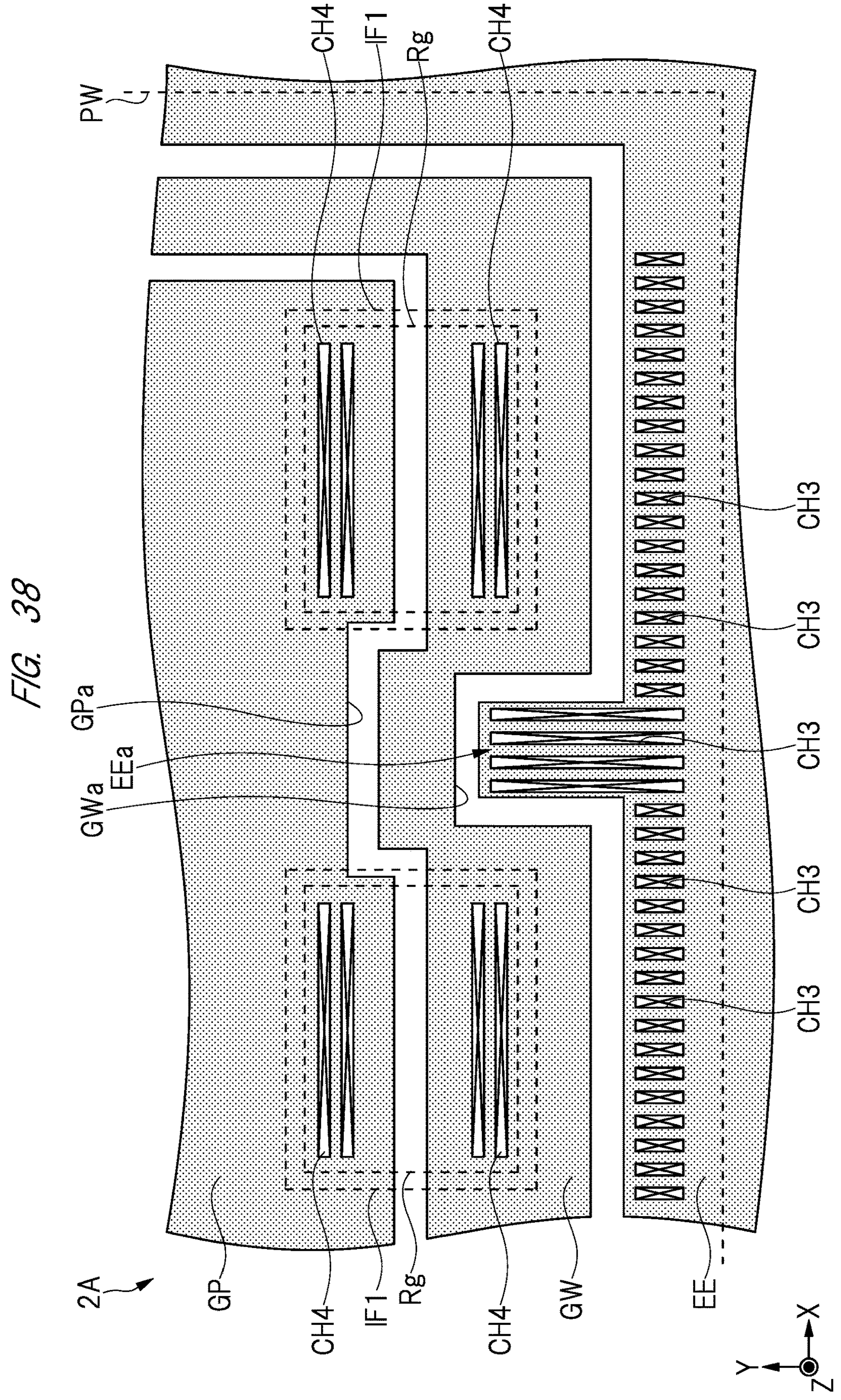
FIG. 38 is a plan view showing a main portion of the semiconductor device according to the sixth embodiment.

In the sixth embodiment, as shown in FIGS. 37 and 38, a convex portion GPa is provided in the gate pad GP located between the two resistance elements Rg, and the widened gate wiring GW is formed so as to pass a region between the convex portion EEa and the concave portion GPa. In this way, according to the sixth embodiment, the width of the gate wiring GW can be ensured, so that the deterioration of the electromigration life can be suppressed.

As described above, the present invention has been described based on the above-mentioned embodiments, but the present invention is not limited to the above-mentioned embodiments and can variously be modified without departing from the scope thereof.

For example, in the above-mentioned embodiments, the IGBT has been exemplified as a device formed in the region 1A, but the technique disclosed in the above-mentioned embodiments is not limited to the IGBT and can also be applied to a power MOSFET having a vertical trench gate structure.

Further, the material used for the semiconductor substrate SUB is not limited to silicon (Si), and may be silicon carbide (SiC), gallium nitride (GaN), gallium oxide (Ga2O3), or the like.

What is claimed is:

1. A semiconductor device comprising:

a semiconductor substrate of a first conductivity type, the semiconductor substrate having an upper surface and a lower surface;

a well region of a second conductivity type opposite to the first conductivity type, the well region being formed in the semiconductor substrate on an upper surface side of the semiconductor substrate;

a first insulating film and a second insulating film formed on the well region;

a first resistance element formed on the first insulating film;

a second resistance element formed on the second insulating film;

an interlayer insulating film formed on the upper surface of the semiconductor substrate so as to cover the first resistance element and the second resistance element;

a gate pad formed on the interlayer insulating film and connected to an external connection member;

an emitter electrode formed on the interlayer insulating film; and a gate wiring formed on the interlayer insulating film, located between the gate pad and the emitter electrode, and extending in a first direction in a plan view, wherein the first resistance element and the second resistance element are each formed to overlap a portion of each of the gate pad and the gate wiring in the plan view, and are electrically connected to the gate pad and the gate wiring, wherein the well region overlaps a portion of each of the first insulating film, the second insulating film, the first resistance element, the second resistance element, the gate pad, the gate wiring, and the emitter electrode in the plan view, wherein the emitter electrode includes a convex portion that protrudes toward a gate pad side in a second direction perpendicular to the first direction in the plan view, wherein the convex portion is located between the first resistance element and the second resistance element in the plan view, and wherein the convex portion and the well region are electrically connected via a hole formed in the interlayer insulating film.

2. The semiconductor device according to claim 1, wherein the convex portion and the well region are electrically connected via a plurality of holes formed in the interlayer insulating film, the plurality of holes being configured by the hole.

3. The semiconductor device according to claim 1, wherein the convex portion is provided at a position closer to a central portion of the gate pad than an end portion of the gate pad in the first direction.

4. The semiconductor device according to claim 1, wherein a first connection portion connecting the first insulating film and the second insulating film is formed on the well region, and wherein the first insulating film, the second insulating film, and the first connection portion are an integrated insulating film.

5. The semiconductor device according to claim 4, wherein the hole is formed so as to penetrate through the interlayer insulating film and the first connection portion and reach the well region.

6. The semiconductor device according to claim 4, wherein a second connection portion connecting the first resistance element and the second resistance element is formed on the first connection portion, wherein the first resistance element, the second resistance element, and the second connection portion are an integrated conductive film, and wherein the second connection portion is located below the gate pad and opposes the convex portion in the second direction.

7. The semiconductor device according to claim 1, wherein a side surface of the first insulating film and a side surface of the first resistance element are made flush to each other, and wherein a side surface of the second insulating film and a side surface of the second resistance element are made flush to each other.

8. The semiconductor device according to claim 1, wherein a concave portion is provided in the gate pad located between the first resistance element and the second resistance element in the plan view, and wherein the gate wiring is formed so as to pass a region between the convex portion and the concave portion.

9. The semiconductor device according to claim 1, further comprising:

a first region where an IGBT is formed; and a second region where the first resistance element and the second resistance element are formed, wherein the IGBT further includes:

a pair of first trenches formed in the semiconductor substrate in the first region on the upper surface side of the semiconductor substrate;

a pair of first gate insulating films formed in the pair of first trenches;

a pair of first gate electrodes embedded in the pair of first trenches via the pair of first gate insulating films;

a hole barrier region of the first conductivity type, the hole barrier region being formed in the semiconductor substrate between the pair of first trenches on the upper surface side of the semiconductor substrate;

a base region of the second conductivity type, the base region being formed in the hole barrier region;

an emitter region of the first conductivity type, the emitter region being formed in the base region;

a floating region of the second conductivity type, the floating region being formed in the semiconductor substrate in the first region other than a region between the pair of first trenches on the upper surface side of the semiconductor substrate;

a collector region of the second conductivity type, the collector region being formed in the semiconductor substrate in the first region and the second region on a lower surface side of the semiconductor substrate; and a collector electrode formed under the lower surface of the semiconductor substrate in the first region and the second region, wherein the pair of first gate electrodes are electrically connected to the gate wiring, wherein the emitter region and the base region are electrically connected to the emitter electrode, wherein the collector region is electrically connected to the collector electrode, and wherein the floating region is physically separated from the well region and is electrically in a floating state.

10. A method of manufacturing a semiconductor device, the method comprising:

(a) preparing a semiconductor substrate of a first conductivity type, the semiconductor substrate having an upper surface and a lower surface;

(b) forming a first insulating film and a second insulating film on the upper surface of the semiconductor substrate;

(c) forming a well region of a second conductivity type in the semiconductor substrate on an upper surface side of the semiconductor substrate, the second conductivity type being opposite to the first conductivity type;

(d) forming a first resistance element on the first insulating film, and forming a second resistance element on the second insulating film;

(e) forming an interlayer insulating film on the upper surface of the semiconductor substrate so as to cover the first resistance element and the second resistance element;

(f) forming a hole in the interlayer insulating film, the hole reaching the well region; and (g) forming a gate pad, an emitter electrode, and a gate wiring for connection to an external connection member on the interlayer insulating film, wherein the gate wiring is located between the gate pad and the emitter electrode, and extends in a first direction in a plan view, wherein the first resistance element and the second resistance element are each formed so as to overlap a portion of each of the gate pad and the gate wiring in a plan view, and are electrically connected to the gate pad and the gate wiring, wherein the well region overlaps a portion of each of the first insulating film, the second insulating film, the first resistance element, the second resistance element, the gate pad, the gate wiring, and the emitter electrode in the plan view, wherein the emitter electrode includes a convex portion that protrudes toward a gate pad side in a second direction perpendicular to the first direction in the plan view, wherein the convex portion is located between the first resistance element and the second resistance element in the plan view, and wherein the convex portion and the well region are electrically connected via the hole.

11. The method according to claim 10, wherein in the (f), a plurality of holes are formed, the plurality of holes being configured by the hole, wherein the convex portion and the well region are electrically connected via the plurality of holes.

12. The method according to claim 10, wherein the convex portion is provided at a position closer to a central portion of the gate pad than an end portion of the gate pad in the first direction.

13. The method according to claim 10, wherein in the (b), a first connection portion connecting the first insulating film and the second insulating film is formed, and wherein the first insulating film, the second insulating film, and the first connection portion are an integrated insulating film.

14. The method according to claim 13, wherein in the (f), the hole is formed so as to penetrate through the interlayer insulating film and the first connection portion and reach the well region.

15. The method according to claim 13, wherein in the (d), a second connection portion connecting the first resistance element and the second resistance element is formed on the first connection portion, wherein the first resistance element, the second resistance element, and the second connection portion are an integrated conductive film, and wherein the second connection portion is located below the gate pad, and opposes the convex portion in the second direction.

16. The method according to claim 10, wherein the (b) has:

(b1) between the (a) and the (c), forming a hard mask on the upper surface of the semiconductor substrate so as to selectively cover the upper surface of the semiconductor substrate; and (b2) between the (b1) and the (c), performing a thermal oxidation treatment to the semiconductor substrate, and forming the first insulating film and the second insulating film on the upper surface of the semiconductor substrate exposed from the hard mask, and wherein the (d) has:

(d1) between the (c) and the (e), forming a third insulating film on the upper surface of the semiconductor substrate so as to cover the first insulating film and the second insulating film;

(d2) between the (d1) and the (e), forming a first conductive film on the third insulating film; and (d3) between the (d2) and the (e), by selectively patterning the first conductive film, forming the first resistance element on the first insulating film, the first resistance element being a portion of the first conductive film, and forming the second resistance element on the second insulating film, the second resistance element being a portion of the first conductive film.

17. The method according to claim 10, wherein the (b) and the (d) are performed as a series of (h) between the (c) and the (e), wherein the (h) has:

(h1) forming a third insulating film on the upper surface of the semiconductor substrate;

(h2) forming a first conductive film on the third insulating film; and (h3) by selectively patterning the first conductive film and the third insulating film, forming the first insulating film and the second insulating film on the upper surface of the semiconductor substrate, each of the first insulating film and the second insulating film being a portion of the third insulating film, forming the first resistance element on the first insulating film, the resistance element being a portion of the first conductive film, and forming the second resistance element on the second insulating film, the second resistance element being a portion of the first conductive film, wherein a side surface of the first insulating film and a side surface of the first resistance element are made flush to each other, and wherein a side surface of the second insulating film and a side surface of the second resistance element are made flush to each other.

18. The method according to claim 10, wherein a convex portion is provided in the gate pad located between the first resistance element and the second resistance element in the plan view, and wherein the gate wiring is formed so as to penetrate through a region between the convex portion and the concave portion.

19. The method according to claim 10, wherein the semiconductor device includes a first region where an IGBT is formed, and a second region where the first resistance element and the second resistance element are formed, wherein the method further comprising:

(i) forming a hole barrier region of the first conductivity type in the semiconductor substrate in the first region on the upper surface side of the semiconductor substrate;

(j) forming a floating region of the second conductivity type in the semiconductor substrate in the first region on the upper surface side of the semiconductor substrate;

(k) forming a pair of first trenches in the semiconductor substrate in the first region on the upper surface side of the semiconductor substrate;

(l) forming a pair of first gate insulating films in the pair of first trenches;

(m) embedding a pair of first gate electrodes into the pair of first trenches via the pair of first gate insulating films;

(n) forming a base region of the second conductivity type in the hole barrier region;

(o) forming an emitter region of the first conductivity type in the base region;

(p) forming a collector region of the second conductivity type in the semiconductor substrate in the first region and the second region on a lower surface side of the semiconductor substrate; and (q) forming a collector electrode under the lower surface of the semiconductor substrate in the first region and the second region, wherein the hole barrier region is formed in the semiconductor substrate in the first region between the pair of first trenches, wherein the floating region is formed in the semiconductor substrate in the first region other than a region between the pair of first trenches, wherein the pair of first gate electrodes are electrically connected to the gate wiring, wherein the emitter region and the base region are electrically connected to the emitter electrode, wherein the collector region is electrically connected to the collector electrode, wherein the (c) and the (j) are performed as a same step, and wherein the floating region is physically separated from the well region and is electrically in a floating state.

* * * * *